United States Patent
Yamada et al.

(10) Patent No.: US 11,159,085 B2
(45) Date of Patent: Oct. 26, 2021

(54) INTEGRATED CIRCUIT AND SWITCHING CIRCUIT

(71) Applicant: FUJI ELECTRIC CO., LTD., Kawasaki (JP)

(72) Inventors: Ryuji Yamada, Kawasaki (JP); Ryuunosuke Araumi, Kawasaki (JP); Takato Sugawara, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/696,549

(22) Filed: Nov. 26, 2019

(65) Prior Publication Data
US 2020/0186030 A1   Jun. 11, 2020

(30) Foreign Application Priority Data

Dec. 10, 2018 (JP) .............................. JP2018-230611
May 14, 2019 (JP) .............................. JP2019-091142

(51) Int. Cl.
*H02M 3/156* (2006.01)
*H02M 1/08* (2006.01)

(52) U.S. Cl.
CPC .............. *H02M 3/156* (2013.01); *H02M 1/08* (2013.01)

(58) Field of Classification Search
CPC ....................... H02M 1/08–0845; H02M 3/156
See application file for complete search history.

(56) References Cited

U.S. PATENT DOCUMENTS

| 2005/0035797 | A1* | 2/2005 | Frans | H03L 7/0812 327/156 |
| 2012/0262082 | A1* | 10/2012 | Esaki | H05B 45/37 315/224 |
| 2013/0307497 | A1* | 11/2013 | Chen | H02M 1/4225 323/235 |
| 2017/0237356 | A1* | 8/2017 | Chen | H02M 3/33553 363/21.02 |
| 2018/0269780 | A1* | 9/2018 | Tsou | H02M 1/083 |

FOREIGN PATENT DOCUMENTS

| JP | 2001-025242 A | 1/2001 |
| JP | 2003-153542 A | 5/2003 |
| JP | 2011-120440 A | 6/2011 |
| JP | 2013-055797 A | 3/2013 |

* cited by examiner

*Primary Examiner* — Peter M Novak
(74) *Attorney, Agent, or Firm* — Rabini & Berdo, P.C.

(57) ABSTRACT

An integrated circuit that drives a switching device provided between a first line on a ground side and a second line on a power supply side, when a power supply voltage is applied between a first input terminal connected with a first capacitor and a second input terminal, the first capacitor having one end grounded and another end connected to the first input terminal, the integrated circuit includes: a first terminal connected to a circuit element, the circuit element having one end grounded and another end connected to the first terminal; and a drive circuit that changes a voltage at the first terminal to one logic level when a drive signal of the switching device changes to the one logic level, and changes the voltage at the first terminal to another logic level when the drive signal changes to the other logic level.

18 Claims, 17 Drawing Sheets

US 11,159,085 B2

INTEGRATED CIRCUIT AND SWITCHING CIRCUIT

CROSS-REFERENCE TO RELATED APPLICATION

The present application claims priority pursuant to 35 U.S.C. § 119 from Japanese Patent Application Nos. 2018-230611 and 2019-091142, filed Dec. 10, 2018 and May 14, 2019, respectively, the entire disclosure of which is hereby incorporated by reference herein.

TECHNICAL FIELD

The present disclosure relates to an integrated circuit and a switching circuit.

BACKGROUND ART

In a power-factor correction circuit (PFC circuit), a leakage current may flow through a parasitic capacitance in the circuit due to a high frequency voltage caused by an operation of a switching device. This leakage current flows into a grounded capacitor, thereby causing fluctuation of a voltage to the ground at a circuit input part. In order to reduce such fluctuation of a voltage to the ground, disclosed is a technique for generating an auxiliary current by providing auxiliary winding to a reactor in a circuit to cancel a leakage current (for example, Japanese Patent Application Publication No. 2003-153542).

However, the technique disclosed in Japanese Patent Application Publication No. 2003-153542 uses an auxiliary winding that generates an auxiliary current to cancel a leakage current. This increases the cost of manufacturing a PFC circuit in general.

An object of the present disclosure is to provide an integrated circuit that generates a current for canceling a leakage current with an inexpensive configuration.

SUMMARY

A main aspect of the present disclosure for solving an issue described above is an integrated circuit that drives a switching device provided between a first line on a ground side and a second line on a power supply side, when a power supply voltage is applied between a first input terminal connected with a first capacitor and a second input terminal, the first capacitor having one end grounded and another end connected to the first input terminal, the integrated circuit comprising: a first terminal connected to a circuit element, the circuit element having one end grounded and another end connected to the first terminal; and a drive circuit that changes a voltage at the first terminal to one logic level when a drive signal of the switching device changes to the one logic level, and changes the voltage at the first terminal to another logic level when the drive signal changes to the other logic level.

According to the present disclosure, it is possible to provide an integrated circuit for generating a current for canceling a leakage current with an inexpensive configuration.

DETAILED DESCRIPTION

At least the following details will become apparent from descriptions of the present specification and of the accompanying drawings.

Configuration of Switching Circuit 10

Figure 1:
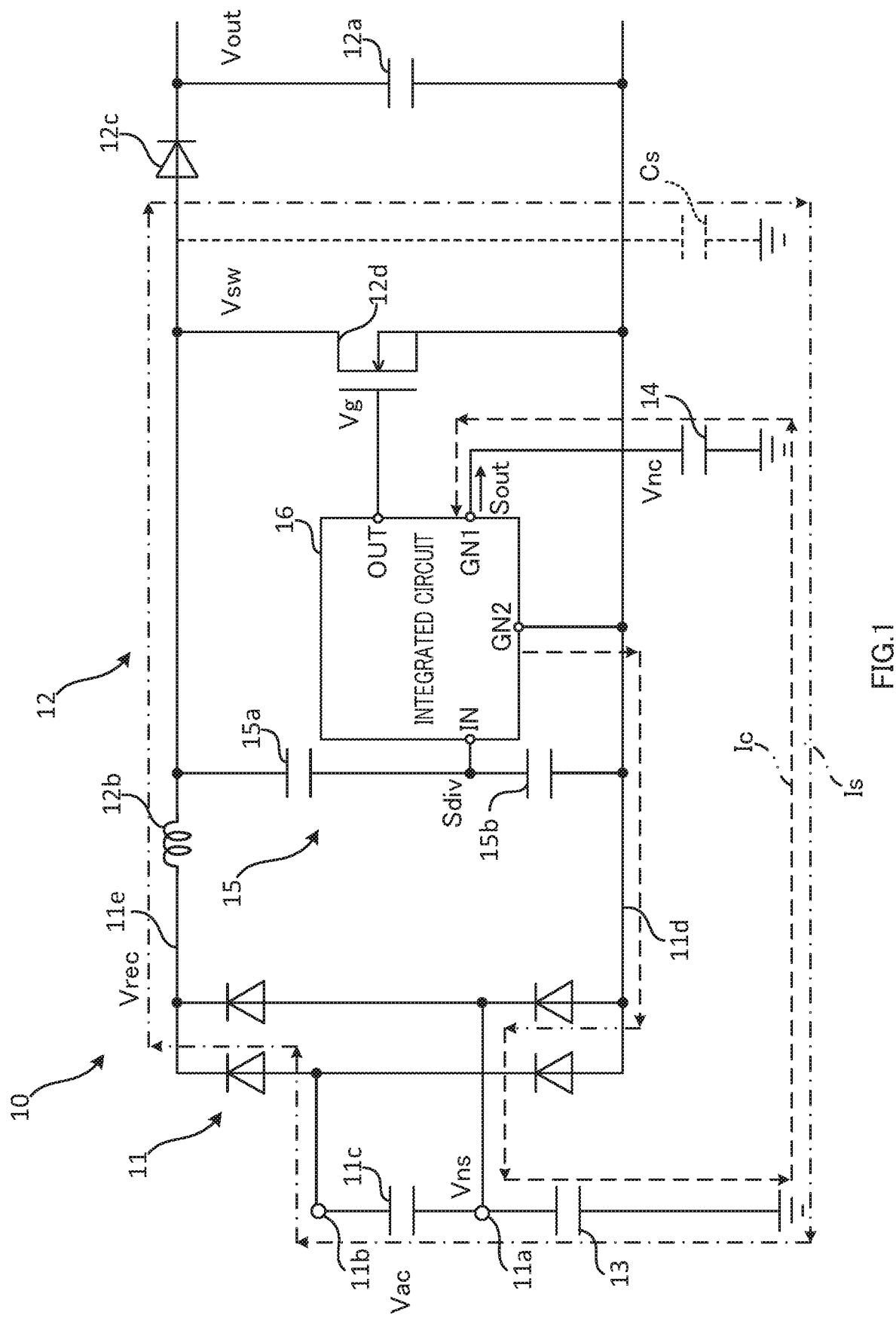
FIG. 1 is a diagram illustrating an example of a switching circuit.

FIG. 1 is a diagram illustrating an example of a switching circuit 10. The switching circuit 10 is a power supply circuit that performs switching of a switching device 12d to generate an output voltage Vout of a target level from an AC voltage Vac of a commercial power supply. As illustrated in FIG. 1, the switching circuit 10 includes, for example, a rectifier circuit 11, a boost chopper circuit 12, a grounded capacitor 13, a compensation element 14, an edge detection circuit 15, and an integrated circuit 16.

The rectifier circuit 11 full-wave rectifies a predetermined AC voltage Vac (power supply voltage) to be applied between an AC input terminal 11a (first input terminal) and an AC input terminal 11b (second input terminal), for example. The rectifier circuit 11 full-wave rectifies the applied predetermined AC voltage Vac and outputs the result to an inductor 12b as a voltage Vrec. Here, the AC voltage Vac is, for example, a voltage having an effective value of 140 to 240 V and a frequency of 50 to 60 Hz. Note that a capacitor 11c provided between the AC input terminals 11a and 11b is a capacitor removes a ripple voltage between the lines. The rectifier circuit 11 is connected to a first line 11d on a ground side and a second line 11e on a power supply side. The first line 11d is connected to a chassis or a housing to be grounded, through the compensation element 14, which will be described later.

The boost chopper circuit 12 generates an output voltage Vout of a target level from an AC voltage Vac of a commercial power supply. The boost chopper circuit 12 includes, for example, a capacitor 12a, an inductor 12b, a diode 12c, and a switching device 12d (refer to the following). A capacitor charging voltage results in a DC output voltage Vout. Note that the output voltage Vout is, for example, 400 V.

The switching device 12d is an NMOS transistor provided between the first line 11d and the second line 11e to control power to a load (not illustrated). Note that the switching device 12d is a metal oxide semiconductor (MOS) transistor in an embodiment of the present disclosure but the present disclosure is not limited thereto. The switching device 12d may be any transistor as long as it can control power and may, for example, be a bipolar transistor or an insulated gate bipolar transistor (IGBT).

The switching device 12d has a gate electrode connected to a terminal OUT of the integrated circuit 16, a source electrode connected to the first line 11d on the ground side, and a drain electrode connected to the second line 11e on the power supply side.

Figure 11:
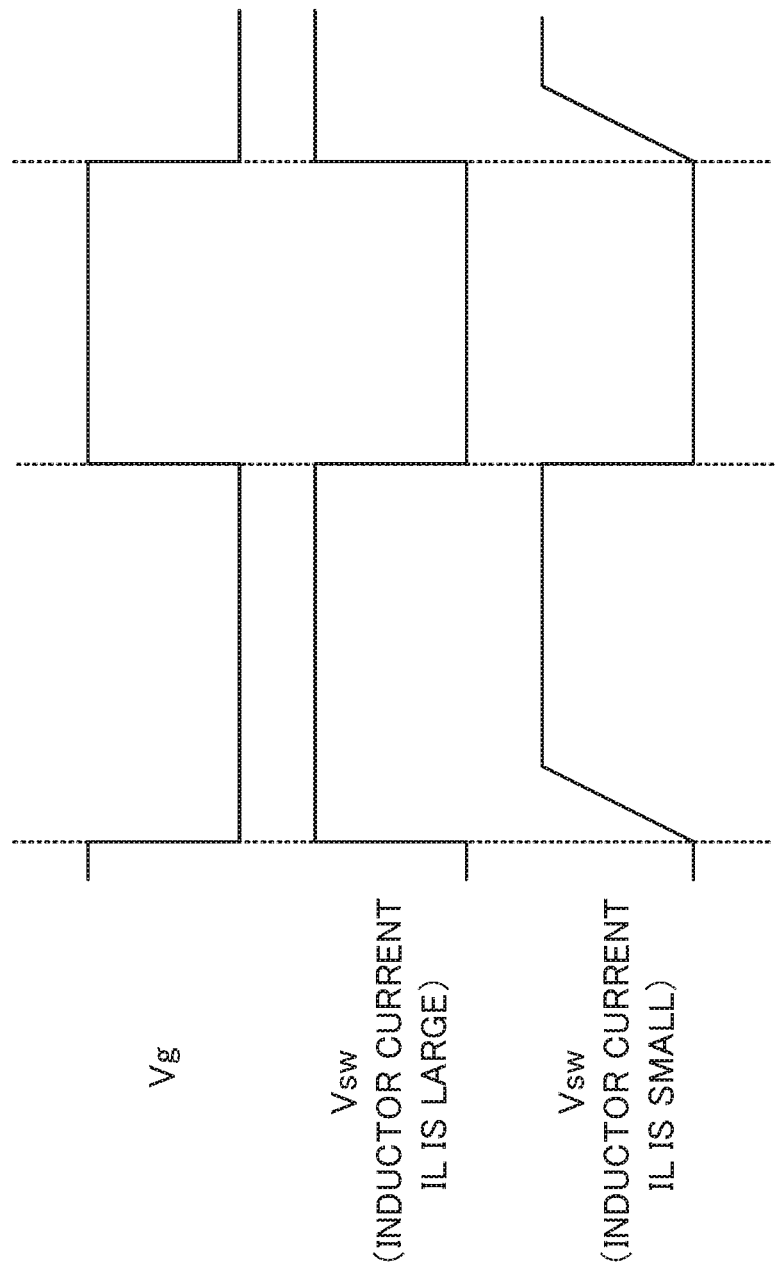
FIG. 11 is a diagram for illustrating a relationship between an inductor current IL and a switching voltage Vsw.

Note that a parasitic capacitance Cs is formed in the switching device 12d as illustrated in FIG. 11. The parasitic capacitance Cs is, for example, a capacitance that is formed between the drain electrode of the switching device 12d and the ground.

The grounded capacitor 13 (first capacitor) reduces an increase in voltage to the ground caused by switching operation of the switching device 12d. The grounded capacitor 13 is provided between the AC input terminal 11a and the ground.

The "increase in voltage to the ground" indicates an increase in potential that occurs in the grounded capacitor 13 resulting from dividing a voltage caused by the switching operation of the switching device 12d (hereinafter, referred to as a "switching voltage Vsw" (first voltage)) by the parasitic capacitance Cs (e.g., 10 pF) and the grounded capacitor 13 (e.g., 1000 pF). Note that, in a case where the AC input terminal 11a is open to the ground without providing the grounded capacitor 13, the voltage caused by the switching operation substantially corresponds to an increase in the voltage to the ground at the AC input terminal 11a. In other words, provision of the grounded capacitor 13 to the AC input terminal 11a can reduce the above-described increase in the voltage to the ground.

The compensation element 14 (circuit element) is an electronic component for canceling the leakage current Is flowing through the circuit as a result of the switching operation, and is, for example, a capacitor. As described above, the switching voltage Vsw is divided by the parasitic capacitance Cs and the grounded capacitor 13. With a voltage Vns obtained by voltage-dividing with the grounded capacitor 13, the leakage current Is indicated by alternate long and short dashed lines in FIG. 1 flows between the switching circuit 10 and the ground through the parasitic capacitance Cs. This leakage current Is electromagnetically affects peripheral devices as common mode noise. To address this, in the switching circuit 10, the compensation element 14 is provided to allow a current (hereinafter, referred to as a "compensation current Ic") for canceling the leakage current Is in a direction opposite to a direction of the leakage current Is, to flow between the compensation element 14 and the grounded capacitor 13. Note that, although a capacitor is used as the compensation element 14 that cancels the leakage current Is in an embodiment of the present disclosure, the compensation element 14 may, for example, be a resistor or a resistor and a capacitor connected in series.

Here, to generate the compensation current Ic in the direction opposite to the direction of the leakage current Is, a voltage to be applied to the compensation element 14 (hereinafter, referred to as a "cancel voltage Vnc") is generated to have a phase opposite to the phase of the switching voltage Vsw in the integrated circuit 16 which will be described later. A configuration of the integrated circuit 16 having such a function will be described later in detail.

To reduce the leakage current Is, a compensation current Ic having the same current value as that of the leakage current Is is preferably generated. To generate such a compensation current Ic, a capacitance and a resistance value of the compensation element 14 are to be determined such that the ratio of the capacitance of the parasitic capacitance Cs to the capacitance of the compensation element 14 will be equal to the ratio of the cancel voltage Vnc of the compensation element 14 to the switching voltage Vsw.

The edge detection circuit 15 (voltage divider circuit) detects a change in logic level of the switching voltage Vsw and also divides the switching voltage Vsw to obtain an appropriate voltage level and outputs the result to the integrated circuit 16. As illustrated in FIG. 1, the edge detection circuit 15 includes a capacitor 15a, a capacitor 15b (third capacitor) connected to the capacitor 15a in series. The capacitor 15a has a smaller capacitance than that of the capacitor 15b (e.g., one hundredth). This allows the voltage obtained by dividing the switching voltage Vsw by the ratio between the capacitance of the capacitor 15a and the capacitance of the capacitor 15b (hereinafter, referred to as a "voltage-divided signal Sdiv" (second voltage)) to be applied to a terminal IN of the integrated circuit 16 (e.g., 4 V). The edge detection circuit 15 may be any as long as it can divide the switching voltage Vsw and thus may use, for example, a resistor instead of a capacitor.

Configuration of Integrated Circuit 16

Figure 2:
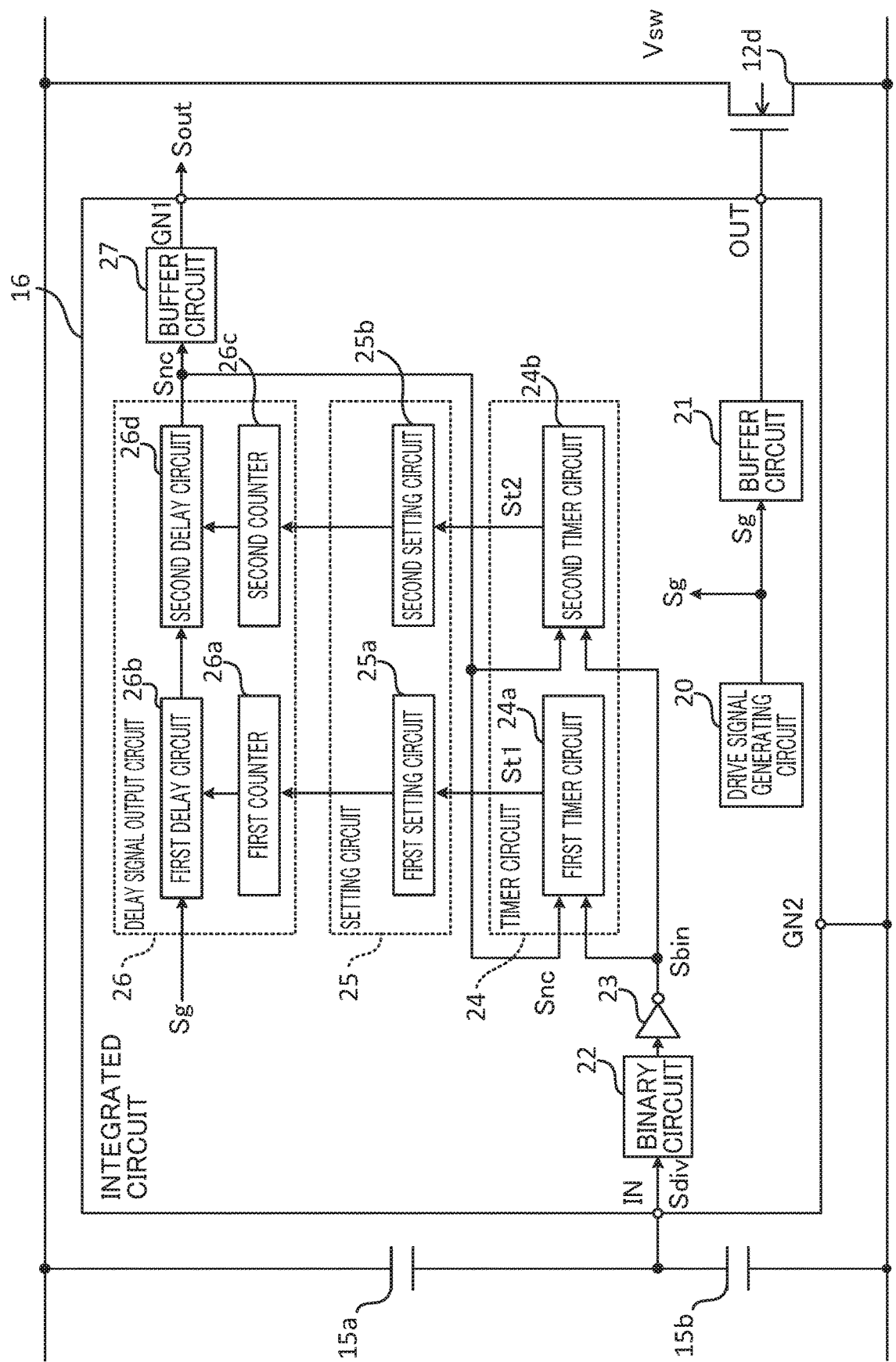
FIG. 2 is a diagram illustrating an example of an integrated circuit.

The integrated circuit 16 in FIG. 2 controls switching of the switching device 12d such that the level of the output voltage Vout will be a target level (e.g., 400 V). The integrated circuit 16 includes, for example, terminals OUT, IN, GN1 (first terminal), and GN2. In an embodiment of the present disclosure, the terminal OUT is connected to a gate electrode of the switching device 12d, the terminal IN is connected to the edge detection circuit 15, the terminal GN1 is grounded through the compensation element 14, and the terminal GN2 is grounded through the rectifier circuit 11 and the grounded capacitor 13. Each block included in the integrated circuit 16 is connected with a line of the terminal GN2. Note that the terminal GN1 corresponds to the first terminal.

The integrated circuit 16 has a function of generating the compensation current Ic in addition to the above-described function. Hence, as will be described below, a drive signal Sg is delayed to apply, to the compensation element 14, the cancel voltage Vnc having a phase opposite to the phase of the switching voltage Vsw.

As illustrated in FIG. 2, the integrated circuit 16 includes, for example, a drive signal generating circuit 20 that outputs the drive signal Sg and a buffer circuit 21. The drive signal generating circuit 20 outputs the drive signal Sg for causing the level of the output voltage Vout to reach a target level, based on the voltage obtained by feeding back the output voltage Vout, for example. The buffer circuit 21 drives the switching device 12d, based on the drive signal Sg output from the drive signal generating circuit 20. This makes it possible to drive the switching device 12d, such as a power transistor having a large gate capacitance, with the input drive signal Sg.

The integrated circuit 16 also includes, for example, a binary circuit 22, an inverter 23, a timer circuit 24, a setting circuit 25, a delay signal output circuit 26, and a buffer circuit 27, to adjust a timing of applying the cancel voltage Vnc to the compensation element 14. Note that these constituent elements configure an "output circuit".

The binary circuit 22 (signal output circuit) compares the voltage-divided signal Sdiv to a threshold voltage of a predetermined level (predetermined voltage) and outputs a binary signal obtained by binarization to the timer circuit 24. Specifically, the binary circuit 22 outputs a high binary signal when the switching device 12d is turned off and the voltage-divided signal Sdiv is at a voltage corresponding to the output voltage Vout, that is, the switching voltage Vsw is high. In contrast, the binary circuit 22 outputs a low binary signal when the switching device 12d is turned on and the voltage-divided signal Sdiv is at a voltage corresponding to the ground, that is, the switching voltage Vsw is low. Hence, the binary signal is low during a time period during which the drive signal Sg is high, while the binary signal is high during a time period during which the drive signal Sg is low. Accordingly, the cycle of the binary signal is the same as the cycle of the drive signal Sg.

The inverter 23 inverts the logic level of the binary signal and outputs the result. As will be described later in detail, this allows the timer circuit 24 to easily measure the time period between a timing of a change in the logic level of the binary signal and a timing of a change in the logic level of the delay signal Snc which will be described later. Note that a description will be given below assuming a signal from the inverter 23 as a binary signal Sbin. Hence, the logic level of the binary signal Sbin is an inverse of the logic level of the switching voltage Vsw.

The timer circuit 24 measures a time period between a timing of a change in the logic level of the delay signal Snc, which will be described later, and a timing of a change in the logic level of the binary signal Sbin. As illustrated in FIG. 2, the timer circuit 24 includes, for example, a first timer circuit 24a and a second timer circuit 24b. A description will be given below as an example assuming the first timer circuit 24a as a circuit for measuring a time period between timings at which two signals rise and assuming the second timer circuit 24b as a circuit for measuring a time period between timings at which the two signals fall.

Figure 3:
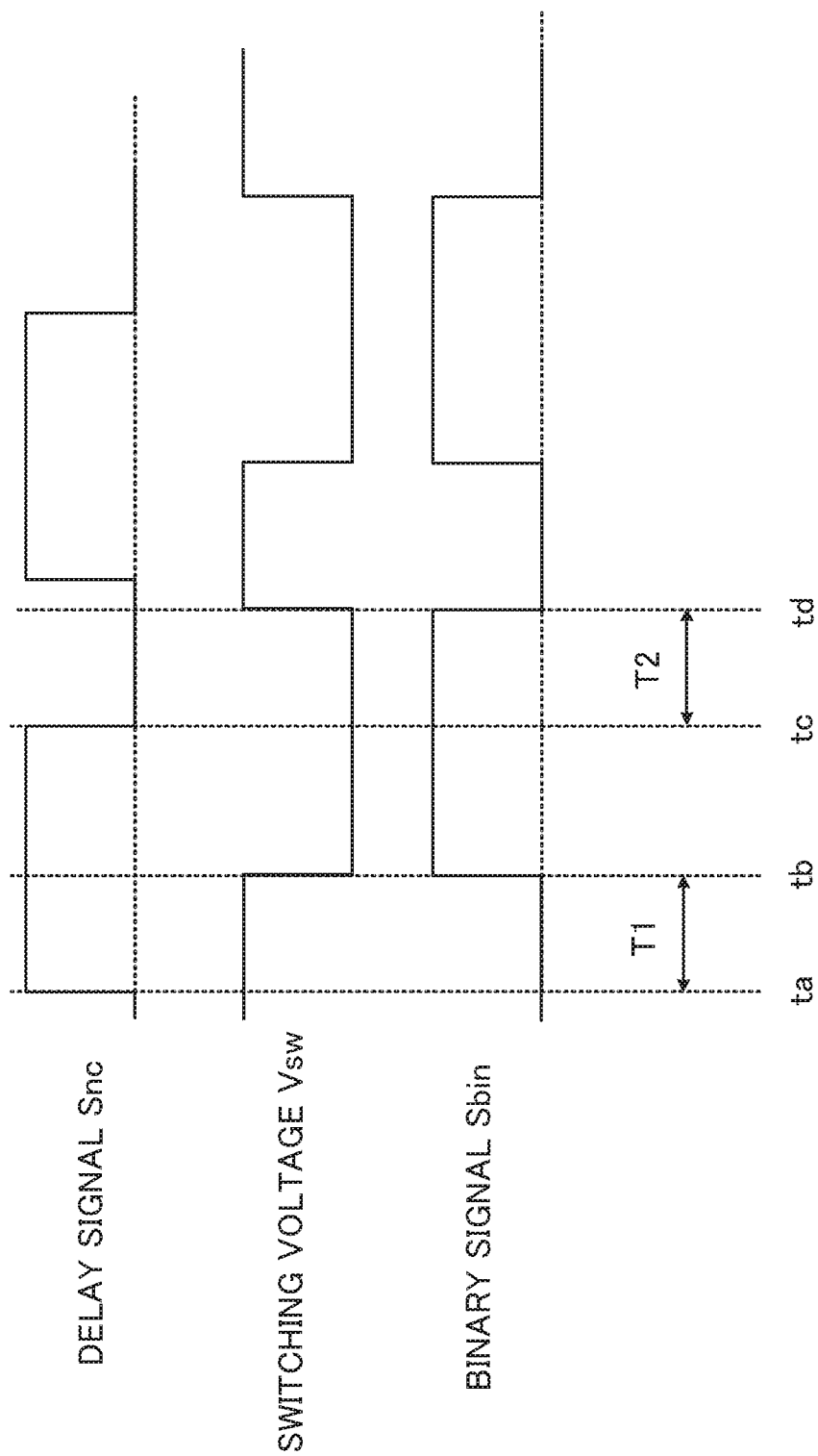
FIG. 3 is a diagram for illustrating a relationship between a delay signal and a binary signal.

As illustrated in FIG. 3, the first timer circuit 24a measures a time period T1 between a time ta of the rising edge of the delay signal Snc and a time tb of the rising edge of the binary signal Sbin. The first timer circuit 24a also outputs, to the setting circuit 25, a signal St1 including information indicating the time period T1 and information indicating which edge of the delay signal Snc or the binary signal Sbin precedes in time, based on the times ta and tb.

The second timer circuit 24b, similarly to the first timer circuit 24a, measures a time period T2 between a time tc of the falling edge of the delay signal Snc and a time td of the falling edge of the binary signal Sbin. The second timer circuit 24b also outputs, to the setting circuit 25, a signal St2 including information indicating the time period T2 and information indicating which edge of the delay signal Snc or the binary signal Sbin precedes in time, based on the times tc and td.

Note that the delay signal Snc is a signal obtained by delaying the drive signal Sg as described above. Since the binary signal Sbin is obtained by inverting the signal from the binary circuit 22 (similar to the signal obtained by dividing the switching voltage Vsw), the binary signal Sbin substantially corresponds to the signal obtained by delaying the drive signal Sg. Hence, the cycle of the binary signal Sbin and the cycle of the delay signal Snc are the same, which results in the time period T1 between the rising edges thereof being equal to the time period T2 between the falling edges thereof.

The setting circuit 25 sets, to the delay signal output circuit 26, setting information for generating the delay signal Snc having a phase opposite to the phase of the switching voltage Vsw, based on the signals St1 and St2 from the timer circuit 24. As illustrated in FIG. 2, the setting circuit 25 includes, for example, a first setting circuit 25a and a second setting circuit 25b. A description will be given below as an example assuming that the first setting circuit 25a obtains a first time period signal St1 from the first timer circuit 24a and the second setting circuit 25b obtains a second time period signal St2 from the second timer circuit 24b.

The first setting circuit 25a determines whether or not the time period T1 is within a predetermined time period Tx. The "time period Tx" is a time period during which the switching voltage Vsw and the delay signal Snc are deemed to have opposite phases. In an embodiment of the present disclosure, the "time period Tx" is assumed, for example, to be a time period corresponding to one tenth of the cycle of the drive signal Sg. For example, in a case where the cycle of the drive signal Sg is 10 μs, the time period Tx is 1 μs. When the time period T1 is within the time period Tx, the first setting circuit 25a causes a first counter 26a, which will be described later, to hold a count value C1.

When the first setting circuit 25a determines that the time period T1 is not within the predetermined time period Tx, the first setting circuit 25a performs a process such that the time period T1 will be within the time period Tx. Specifically, when the delay signal Snc precedes the binary signal Sbin, the first setting circuit 25a increments the count value C1 of the first counter 26a, which will be described later, to increase the delay time of the delay signal Snc. In contrast, when the binary signal Sbin precedes the delay signal Snc, the first setting circuit 25a decrements the count value C1 of the first counter 26a, which will be described later, to decrease the delay time of the delay signal Snc.

The second setting circuit 25b determines whether or not the time period T2 is within the predetermined time period Tx. When the time period T2 is within the time period Tx, the second setting circuit 25b, similarly to the first setting circuit 25a, causes a second counter 26c, which will be described later, to hold a count value C2. When the second setting circuit 25b determines that the time period T2 is not within the predetermined time period Tx, the second setting circuit 25b performs a process such that the time period T2 will be within the time period Tx. This process is similar to the process performed by the first setting circuit 25a, and hence the description thereof is omitted here.

The delay signal output circuit 26 outputs the delay signal Snc obtained by delaying the drive signal Sg by a predetermined time period. As illustrated in FIG. 2, the delay signal output circuit 26 includes, for example, the first counter 26a, a first delay circuit 26b, the second counter 26c, and a second delay circuit 26d. A description will be given below as an example assuming that the count value C1 of the first counter 26a is set by the first setting circuit 25a and the count value C2 of the second counter 26c is set by the second setting circuit 25b.

The first counter 26a (storage circuit) is an updown counter that changes the stored count value C1 (setting information), based on an output from the first setting circuit 25a. The first delay circuit 26b delays the drive signal Sg by a time period corresponding to the count value C1. Specifically, the first delay circuit 26*b* increases the delay time of the drive signal Sg as the count value C1 increases.

The second counter 26*c* (storage circuit) is an updown counter that changes the stored count value C2 (setting information), based on an output from the second setting circuit 25*b*. The second delay circuit 26*d* delays an input signal (drive signal Sg delayed by the first delay circuit 26*b*) by a time period corresponding to the count value C2. Specifically, the second delay circuit 26*d* increases the delay time of the input signal as the count value C2 increases.

The delay signal Snc from the second delay circuit 26*d* is output to the buffer circuit 27 and the timer circuit 24. Note that, as will be described later in detail, when the delay signal Snc and the switching voltage Vsw have opposite phases in either one of the delay times of the first delay circuit 26*b* and the second delay circuit 26*d*, the other delay time may be zero.

The buffer circuit 27 outputs, to the compensation element 14, an output signal Sout having the same phase as the phase of the delay signal Snc, such that the compensation element 14 will be driven according to the delay signal Snc output from the delay signal output circuit 26. Note that the buffer circuit 27 includes, for example, an amplifier circuit (not illustrated) having a high current-driving capability for outputting a desired compensation current Ic when a voltage corresponding to the delay signal Snc is applied to the compensation element 14. Note that the output signal Sout having the same phase as the phase of the delay signal Snc indicates an output signal Sout that goes high when the delay signal Snc goes high at substantially the same timing, and that goes low when the delay signal Snc goes low at substantially the same timing.

Operations of Integrated Circuit 16

An example of operations when the integrated circuit 16 generates the compensation current Ic will be described below. Here, a description will be given, as an example, of a process in which the first setting circuit 25*a* compares the time ta of the rising edge of the delay signal Snc and the time tb of the rising edge of the binary signal Sbin and adjusts the delay signal Snc. In an embodiment of the present disclosure, for example, it is assumed that the count values C1 and C2 are set in the first counter 26*a* and the second counter 26*c* such that the delay time at the first delay circuit 26*b* will be a predetermined time period and the delay time of the second delay circuit 26*d* will be zero.

When the drive signal Sg of a low level is output from the drive signal generating circuit 20 illustrated in FIG. 2, the switching voltage Vsw of a high level is generated between both ends of the switching device 12*d*. The edge detection circuit 15 then applies the voltage obtained by dividing the switching voltage Vsw, to the integrated circuit 16 as the voltage-divided signal Sdiv.

The binary circuit 22 and the inverter 23 generate the binary signal Sbin having a phase opposite to the phase of the switching voltage Vsw, based on the voltage-divided signal Sdiv. The delay signal Snc obtained by delaying the drive signal Sg is output from the delay signal output circuit 26.

The first timer circuit 24*a* outputs, to the first setting circuit 25*a*, the signal St1 including information indicating which edge of the delay signal Snc and the binary signal Sbin precedes in time and information indicating the time period T1, based on the time ta of the rising edge of the delay signal Snc and the time tb of the rising edge of the binary signal Sbin.

Figure 4:
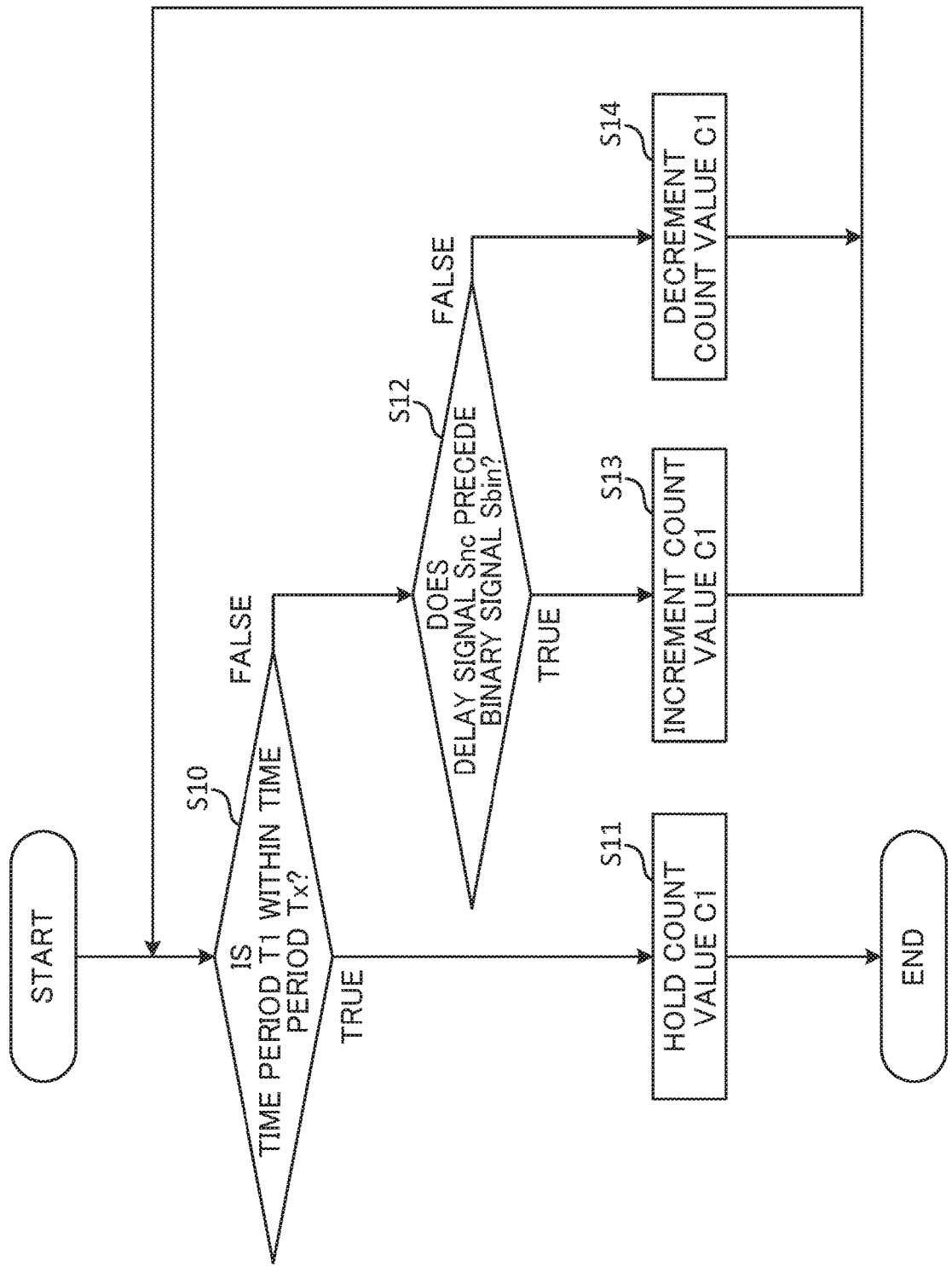
FIG. 4 is a flowchart illustrating an example of a process of adjusting a delay time of a delay circuit.

FIG. 4 is a flowchart illustrating an example of a process performed by the first setting circuit 25*a*. First, the first setting circuit 25*a* determines whether or not the time period T1 between the time ta of the rising edge of the delay signal Snc and the time tb of the rising edge of the binary signal Sbin is within the above-described time period Tx (S10), based on the signal St1. Here, when the delay signal Snc has a phase opposite to the phase of the switching voltage Vsw, i.e., when the time period T1 is within the time period Tx (S10: True), the first counter 26*a* holds the count value C1 (S11). In contrast, when the delay signal Snc does not have a phase opposite to the phase of the switching voltage Vsw, i.e., when the time period T1 is not within the time period Tx (S10: False), the first setting circuit 25*a* determines whether or not the delay signal Snc precedes the binary signal Sbin (S12). When the delay signal Snc precedes the binary signal Sbin (S12: True), the first setting circuit 25*a* increments the count value C1 of the first counter 26*a* (S13). As a result, the delay time of the delay signal Snc increases.

In contrast, when the delay signal Snc does not precede the binary signal Sbin (S12: False), the first setting circuit 25*a* decrements the count value C1 of the first counter 26*a* (S14). As a result, the delay time of the delay signal Snc decreases.

When the processes S13 and S14 are performed and a new count value C1 is set, the delay signal Snc obtained by delaying the drive signal Sg by a delay time corresponding to the set count value C1 is output from the delay signal output circuit 26. The first setting circuit 25*a* then performs the process S10 again, which results in the time period T1 between the rising edge of the delay signal Snc and the rising edge of the binary signal Sbin being shorter than the time period Tx. In other words, when the process of adjusting the delay time, illustrated in FIG. 4, is performed, the delay signal Snc results in having a phase opposite to the phase of the switching voltage Vsw.

The buffer circuit 27 outputs, to the compensation element 14, the output signal Sout having the same phase as the phase of the delay signal Snc. Accordingly, the cancel voltage Vnc having a phase opposite to the phase of the switching voltage Vsw is applied to the compensation element 14.

Through the above, as illustrated in FIG. 1, when the integrated circuit 16 outputs the output signal Sout to apply the cancel voltage Vnc to the compensation element 14, the compensation current Ic in the direction opposite to the direction of the leakage current Is flows into the switching circuit 10. The switching circuit 10 allows the compensation current Ic having the opposite phase to flow in the direction opposite to the direction of the leakage current Is passed by the switching voltage Vsw. This can reduce the effects of the leakage current Is in the integrated circuit 16, which results in reducing change in a voltage to the ground of the AC input terminal 11*a* due to the leakage current Is.

The process in which the first setting circuit 25*a* adjusts the delay time of the delay signal Snc has been described here, but the present disclosure is not limited thereto. For example, a process similar to the process in FIG. 4 is also performed in a case where the second setting circuit 25*b* adjusts the delay time of the delay signal Snc. Also, when the delay time of the delay signal Snc is adjusted such that the time period T2 between the time tc of the falling edge of the delay signal Snc and the time td of the falling edge of the binary signal Sbin will be within the time period Tx, the effects of the leakage current Is can be reduced in the integrated circuit 16. In this case, the time period T1 is replaced with the time period T2, and the count value C1 is replaced with the count value C2, in FIG. 4.

For example, both the first setting circuit 25a and the second setting circuit 25b may perform the process in FIG. 4 to adjust the delay time of the delay signal Snc. In such a case, both of the count values C1 and C2 are adjusted, thereby being able to delay the delay signal Snc by a longer time period, for example.

Figure 5:
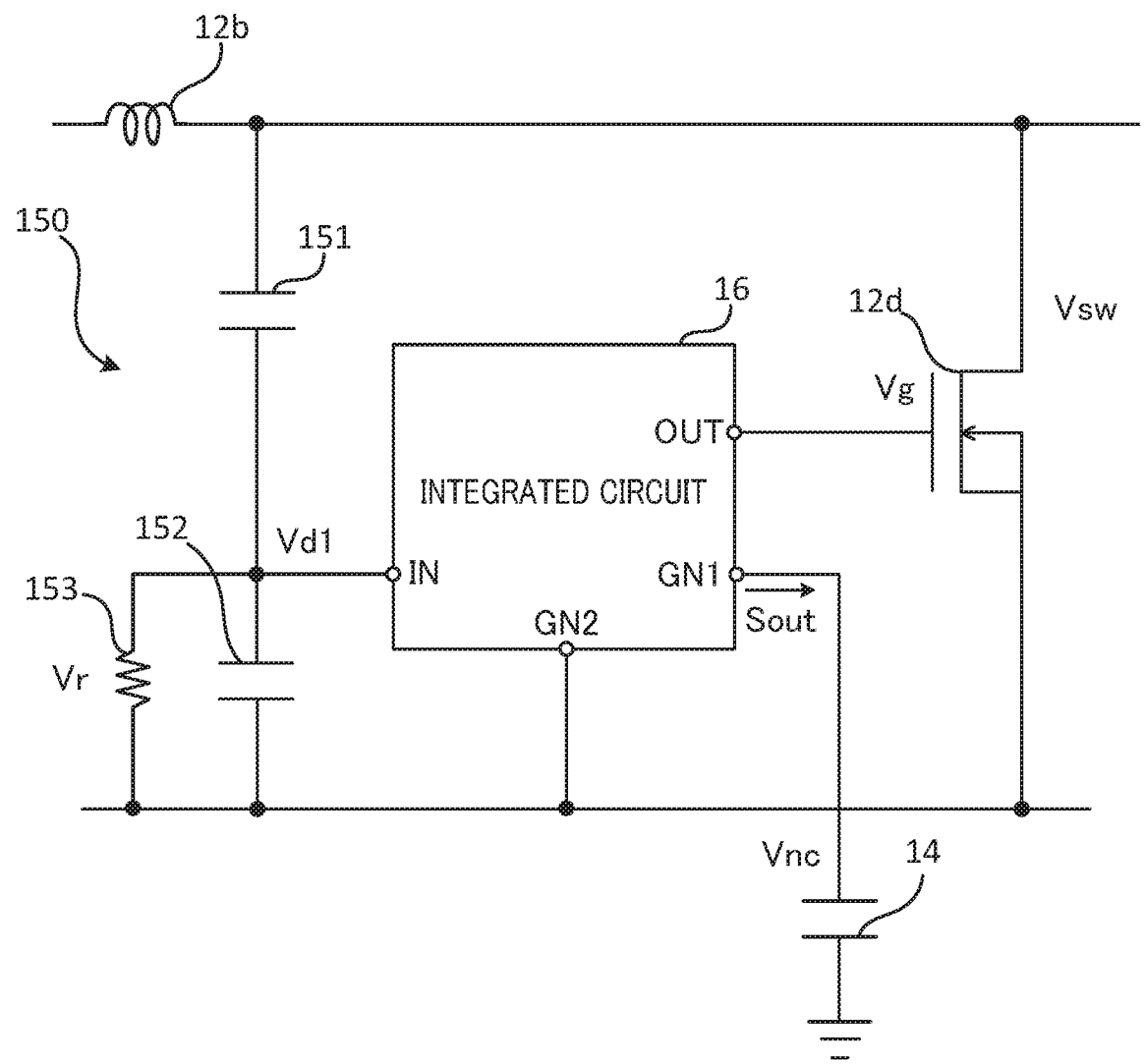
FIG. 5 is a diagram illustrating another example of an edge detection circuit.
Figure 6:
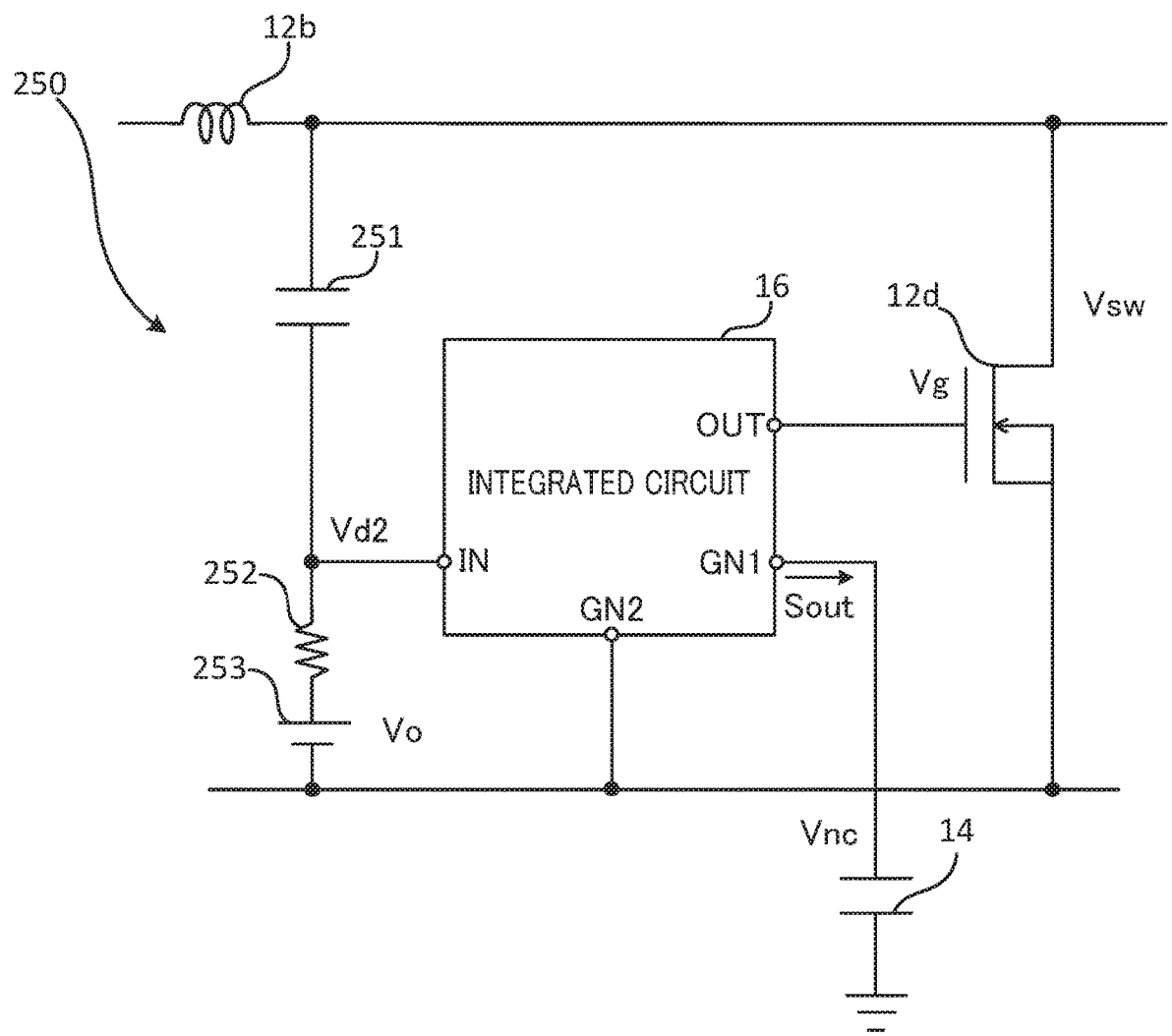
FIG. 6 is a diagram illustrating another example of an edge detection circuit.
Figure 7:
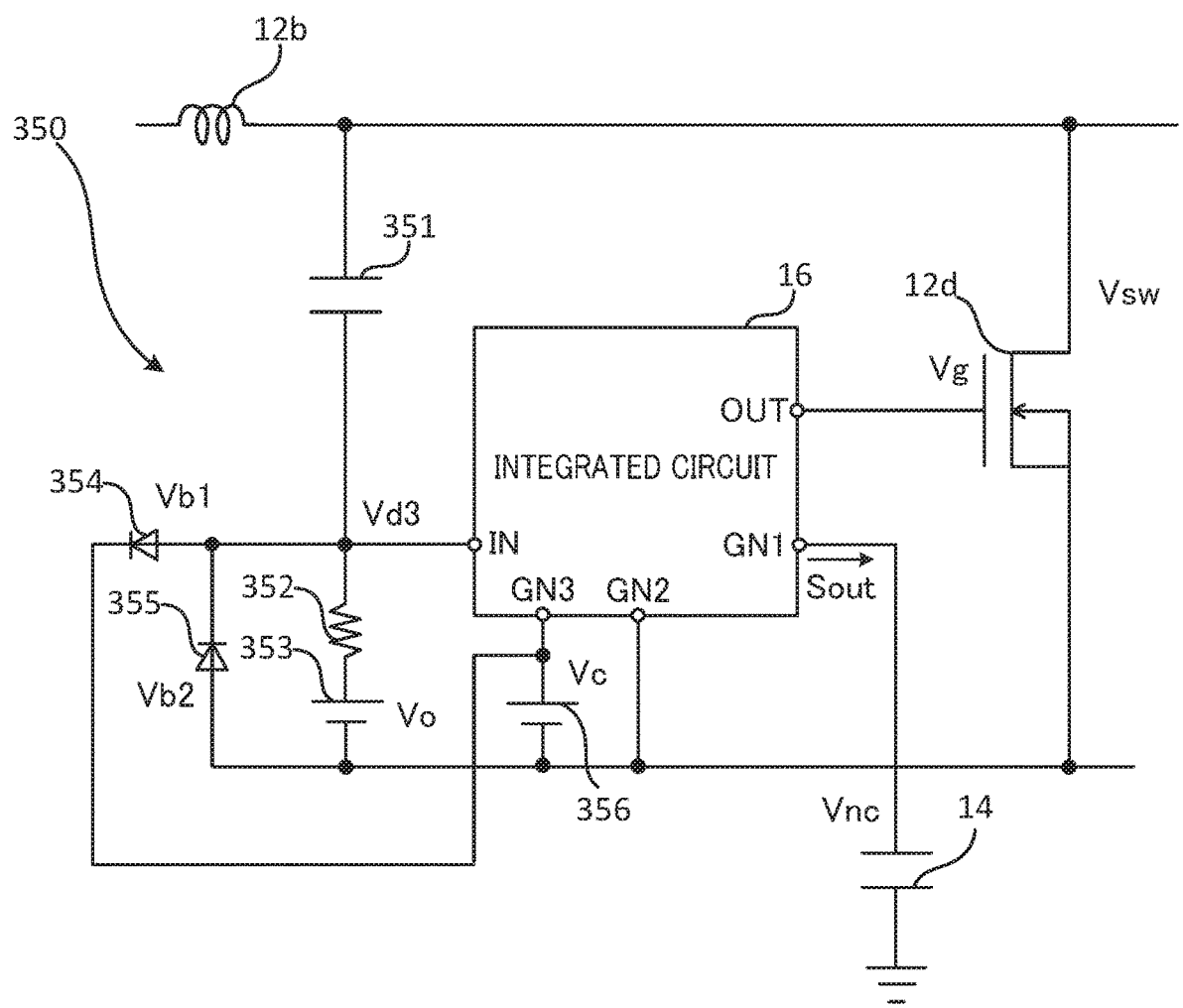
FIG. 7 is a diagram illustrating another example of an edge detection circuit.

Other Embodiments of Edge Detection Circuit:

With reference to FIGS. 5 to 7, other embodiments of the edge detection circuit 15 of the switching circuit 10 will be described.

An edge detection circuit 150, an edge detection circuit 250, and an edge detection circuit 350, similarly to the edge detection circuit 15, detects a change in the logic level of the switching voltage Vsw and also divides the switching voltage Vsw to obtain an appropriate voltage level to output the result to the integrated circuit 16.

The edge detection circuit 150 illustrated in FIG. 5 includes a capacitor 151, a capacitor 152 having one end connected to the capacitor 151 and the other end grounded, and a resistor 153 having one end connected to one end of the capacitor 152 and the other end grounded. A terminal IN of the integrated circuit 16 is connected to the one end of the capacitor 152 and the one end of the resistor 153. Accordingly, when a bias current (from a current supply not illustrated) is passed from the terminal IN of the integrated circuit 16 toward the ground through the resistor 153, a bias voltage Vr is applied. In this way, a divided voltage of the switching voltage Vsw changing around the bias voltage Vr is applied to the terminal IN of the integrated circuit 16.

The edge detection circuit 250 illustrated in FIG. 6 includes a capacitor 251, a resistor 252 having one end connected to the capacitor 251 and the terminal IN, and a DC power supply 253 connected to the other end of the resistor 252. Accordingly, the terminal IN of the integrated circuit 16 is applied with the voltage obtained by dividing the switching voltage Vsw using a DC voltage Vo of the DC power supply 253 as a bias voltage.

The edge detection circuit 350 illustrated in FIG. 7 includes a capacitor 351, a resistor 352 having one end connected to the capacitor 351, a DC power supply 353 connected to the other end of the resistor 352, a diode 354 having an anode connected to the one end of the resistor 352 and a cathode connected to a control power supply 356, and a diode 355 having a cathode connected to the one end of the resistor 352.

Accordingly, the terminal IN of the integrated circuit 16 is applied with the voltage obtained by dividing the switching voltage Vsw, with the DC voltage Vo of the DC power supply 253 as a bias voltage. The voltage applied to the terminal IN is clamped to the voltage higher than a control voltage Vc by a forward voltage Vb1 of the diode 354, on the positive side relative to the DC voltage Vo, and is clamped to the voltage lower than a ground voltage by a forward voltage Vb2 of the diode 355, on the negative side relative to the DC voltage Vo. This makes it possible to prevent a great change in voltage at the terminal IN of the integrated circuit 16.

Figure 8:
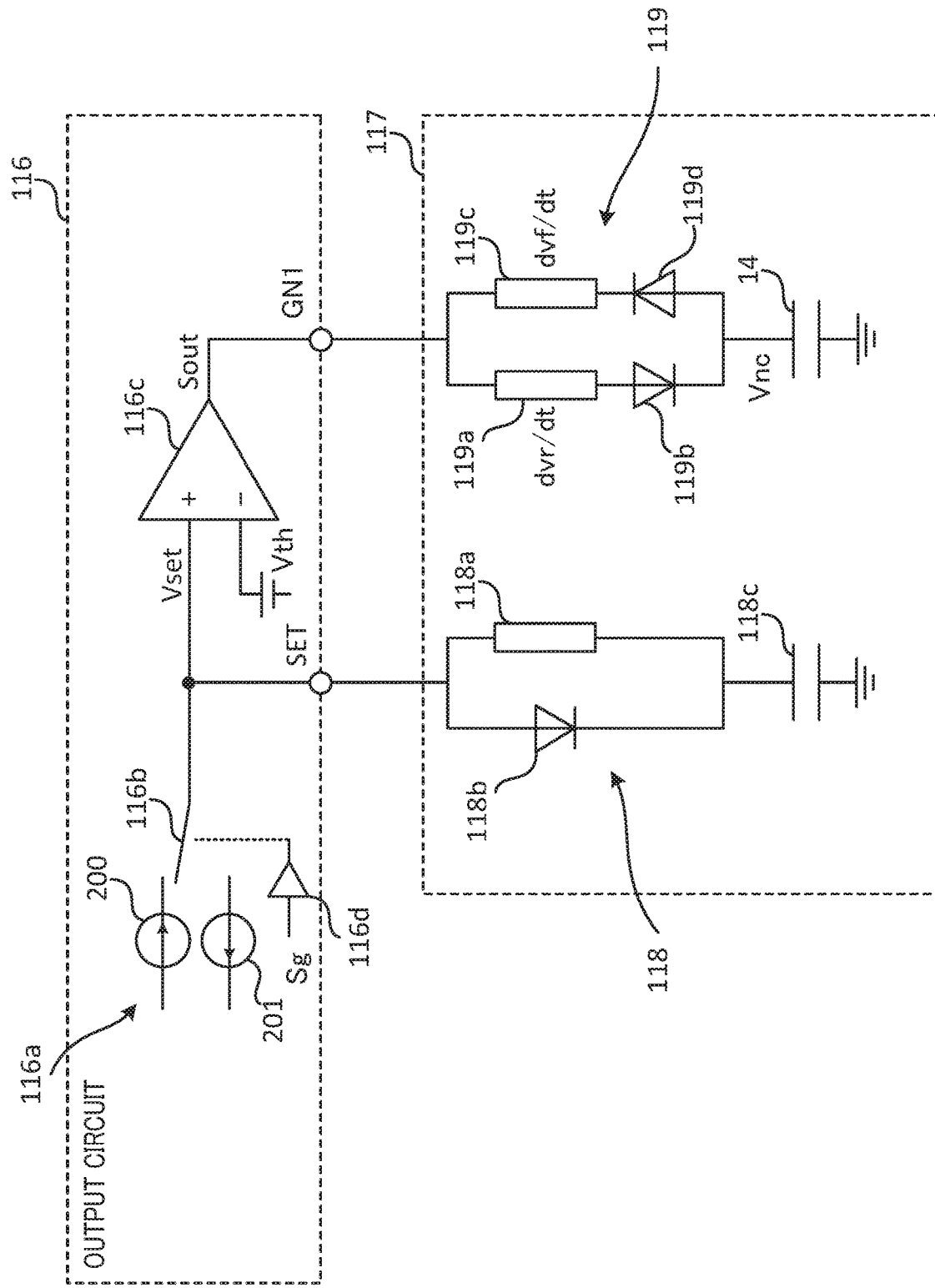
FIG. 8 is a diagram illustrating another example of an integrated circuit.

Another Embodiment of Integrated Circuit:

FIG. 8 is a diagram illustrating an example of an output circuit 116 that adjusts timing of applying the cancel voltage Vnc to the compensation element 14 and outputs the result. Note that the output circuit 116 is provided instead of, for example, the binary circuit 22, the inverter 23, the timer circuit 24, the setting circuit 25, the delay signal output circuit 26, and the buffer circuit 27, in the integrated circuit 16.

The output circuit 116 includes a current supply 116a, a switch 116b, a comparator 116c, and a buffer circuit 116d.

The current supply 116a includes a current supply 200 that generates a predetermined source current and a current supply 201 that generates a predetermined sink current.

The switch 116b, for example, connects the current supply 200 and a terminal SET when the drive signal Sg goes high, and connects the current supply 201 and the terminal SET when the drive signal Sg goes low.

The comparator 116c compares the voltage at the terminal SET to a predetermined voltage Vth and outputs the comparison result as the output signal Sout to the terminal GN1.

The buffer circuit 116d performs switching the switch 116b, based on the drive signal Sg.

An adjustment circuit 117 adjusts timing of the drive signal Sg such that the cancel voltage Vnc having the phase opposite to the phase of the switching voltage Vsw will be applied to the compensation element 14. The adjustment circuit 117 includes a first adjustment circuit 118 and a second adjustment circuit 119.

The first adjustment circuit 118 determines the delay time of the drive signal Sg and includes, for example, a resistor 118a, a diode 118b connected in parallel to the resistor 118a, and a capacitor 118c having one end connected to the resistor 118a and the diode 118b, and the other end connected to the ground.

The second adjustment circuit 119 includes resistors 119a and 119c and diodes 119b and 119d. Here, the resistor 119a and the diode 119b are elements to adjust the rising slope of the output signal Sout output from the comparator 116c and are provided between an output of the comparator 116c and the compensation element 14.

The resistor 119c and the diode 119d are elements to adjust the falling slope of the output signal Sout output from the comparator 116c and are provided between an output of the comparator 116c and the compensation element 14. Note that the compensation element 14 has been already described in relation to the switching circuit 10, and hence a description thereof is omitted.

Figure 9:
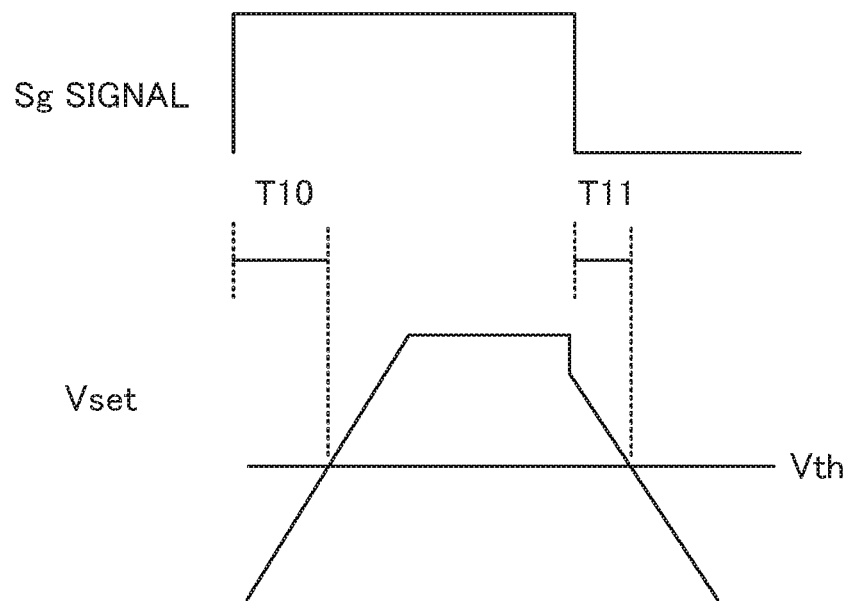
FIG. 9 is a diagram for illustrating a relationship between a drive signal and an output signal.

As illustrated in FIG. 9, when the drive signal Sg is high, the capacitor 118c is charged with a source current through the resistor 118a and the diode 118b. When a time period T10 has elapsed since the drive signal Sg has gone high, a voltage Vset at the terminal SET exceeds the voltage Vth. As a result, the comparator 116c outputs the output signal Sout of a high level. Note that the rising slope of the output signal Sout is adjusted by the resistor 119a and the diode 119b connected to the terminal GN1.

In contrast, when the drive signal Sg goes low, the capacitor 118c is discharged by a sink current through the resistor 118a. When a time period T11 has elapsed since the drive signal Sg has gone low, the voltage Vset of the terminal SET falls below the voltage Vth. As a result, the comparator 116c outputs the output signal Sout of a low level. Note that the falling slope of the output signal Sout is adjusted by the resistor 119a and the diode 119b connected to the terminal GN1.

In this way, here, the output signal Sout obtained by delaying the drive signal Sg by predetermined time periods (time periods T10, T11) is output to the terminal GN1 connected to the compensation element 14. By adjusting the time periods T10 and T11 are adjusted, the cancel voltage Vnc having the phase opposite to the phase of the switching voltage Vsw can be applied to the compensation element 14. Hence, even when such a configuration is used, it is possible to prevent a great change in voltage at the terminal IN of the integrated circuit 16. The compensation element 14 that is applied with the cancel voltage Vnc may be directly connected to the terminal GN1 as illustrated in FIG. 1 or may be connected to the terminal GN1 through a resistor and/or the like as illustrated in FIG. 8.

Figure 10:
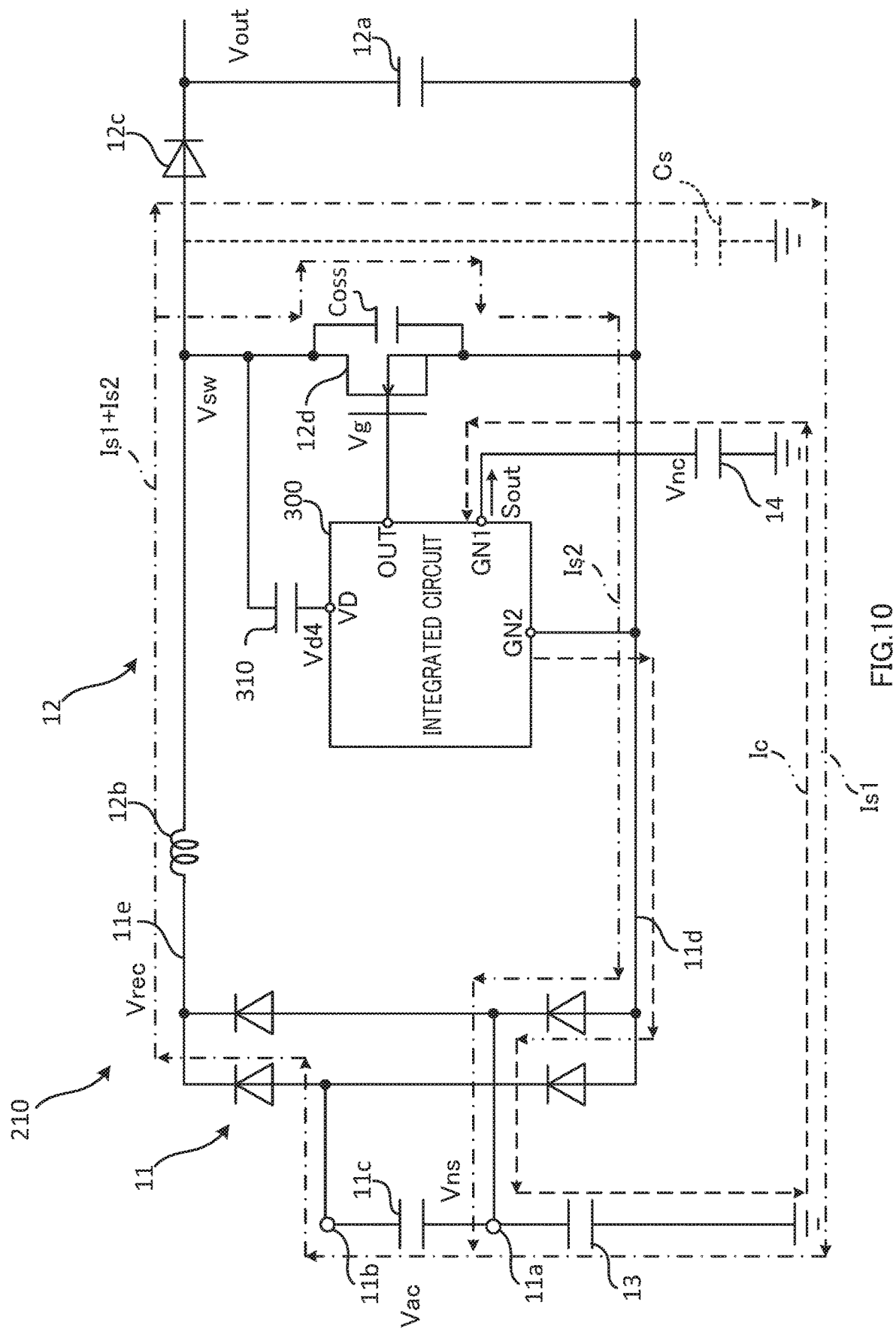
FIG. 10 is a diagram illustrating an example of a switching circuit.

Configuration of Switching Circuit 210:

FIG. 10 is a diagram illustrating an example of a switching circuit 210. The switching circuit 210 is a power supply circuit, similarly to the switching circuit 10, that performs switching of the switching device 12d.

The switching circuit 210 includes, for example, the rectifier circuit 11, the boost chopper circuit 12, the grounded capacitor 13, the compensation element 14, an integrated circuit 300, and a capacitor 310.

Note that the blocks that are given the same reference numerals are the same between the switching circuit 10 and the switching circuit 210. In the switching circuit 210, the integrated circuit 300 is used instead of the integrated circuit 16, and the capacitor 310 for edge detection is used instead of the edge detection circuit 15. Accordingly, the integrated circuit 300 and the capacitor 310 will be mainly described here.

In FIG. 10, a drain-source parasitic capacitance Coss of the switching device 12d is considered. In FIG. 10, it is assumed that, based on the switching voltage Vsw, a current flowing through the parasitic capacitance Cs is denoted by a current Is1 and a current flowing through the parasitic capacitance Coss is denoted by a current Is2.

In general, the value of the parasitic capacitance Coss is greater than the value of the parasitic capacitance Cs that causes noise, for example. Hence, the current Is2 of a great current value is needed in order to charge the parasitic capacitance Coss when the switching device 12d is turned off and the switching voltage Vsw increases, for example, from 0 V to 400 V, which is the level of the output voltage Vout.

The currents Is1 and Is2 are supplied from an inductor current IL of the inductor 12b. Hence, as illustrated in FIG. 11, when the inductor current IL is large and the currents Is1 and Is2 are also large, the time period for the switching voltage Vsw to rise, for example, from 0 V to 400V is short. In contrast, when the inductor current IL is small and the currents Is1 and Is2 are also small, the time period for the switching voltage Vsw to rise, for example, from 0 V to 400V is long. In this way, the rising time of the switching voltage Vsw changes according to the inductor current IL.

As described above, the current Is1 causing noise occurs according to the switching voltage Vsw applied to the parasitic capacitance Cs. Hence, when the switching device 12d is turned off, the current Is1 causing noise changes according to the inductor current IL.

In contrast, when the switching device 12d is turned on, the drain and the source of the switching device 12d are electrically shorted immediately, and hence the falling time of the switching voltage Vsw results in being substantially constant irrespective of the current value of the inductor current IL. Hence, when the switching device 12d is turned on, the timing at which noise occurs is substantially constant irrespective of the inductor current IL.

Figure 12:
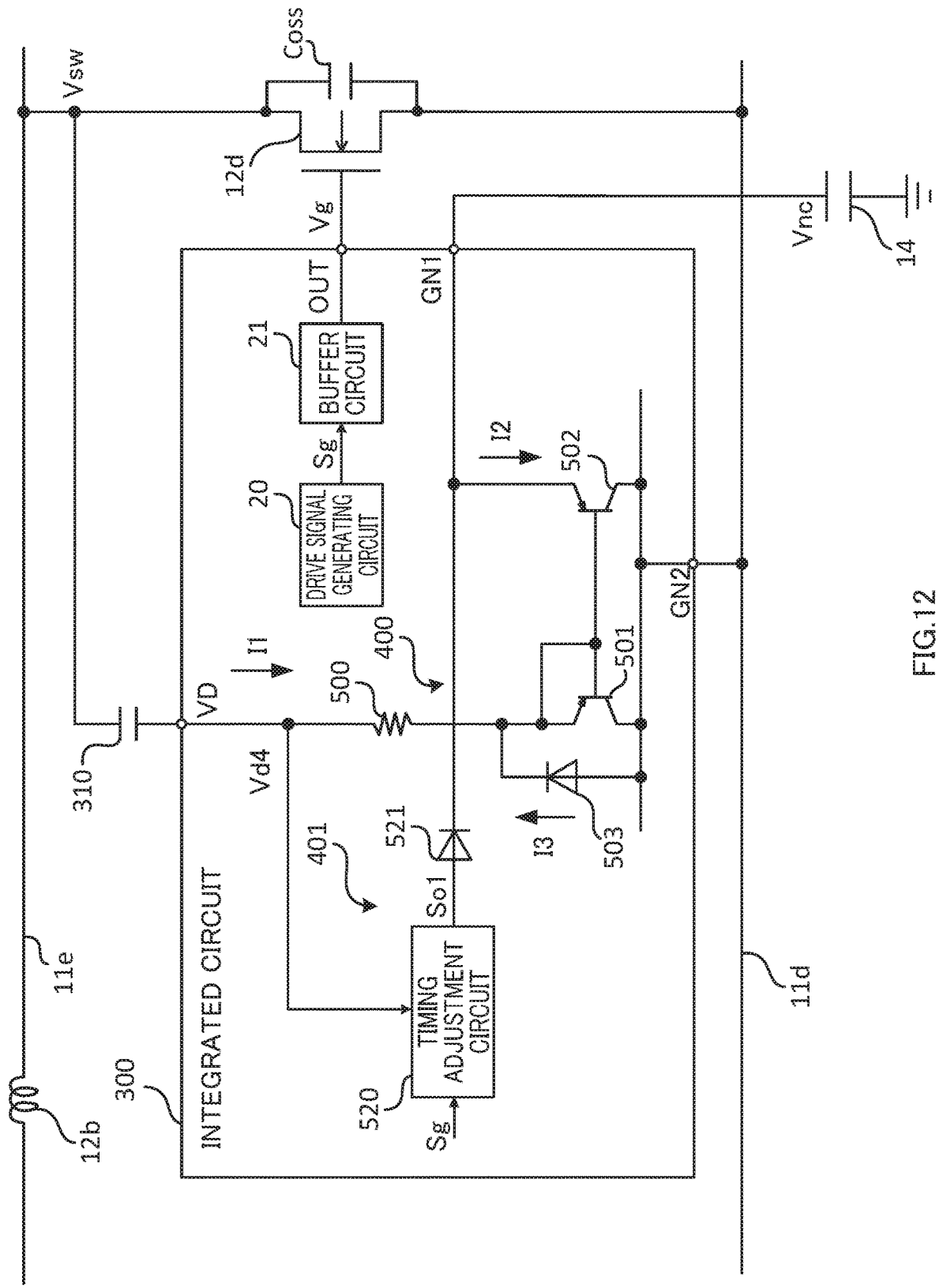
FIG. 12 is a diagram illustrating an example of an integrated circuit.

The integrated circuit 300 performs switching of the switching device 12d and also applies the cancel voltage Vnc following a change in the switching voltage Vsw, to the compensation element 14. As illustrated in FIG. 12, the integrated circuit 300 includes terminals VD, GN1, GN2, and OUT, the drive signal generating circuit 20, the buffer circuit 21, a sink current circuit 400, and an output circuit 401. Note that the terminals GN1, GN2, and OUT, the drive signal generating circuit 20, and the buffer circuit 21 are the same elements as the elements in the switching circuit 10. The sink current circuit 400 and the output circuit 401 correspond to a "drive circuit".

The terminal VD (second terminal) is a terminal for detecting timing of a change in the switching voltage Vsw. The terminal VD is connected to the capacitor 310 (second capacitor), the capacitor 310 has one end connected to the drain (node on a power supply side) of the switching device 12d and the other end connected to the terminal VD.

The sink current circuit 400 changes the cancel voltage Vnc at the terminal GN1 connected to the compensation element 14 to a low level, when the switching device 12d is turned off. Specifically, the sink current circuit 400 absorbs, from the terminal GN1, a sink current corresponding to the current flowing through the parasitic capacitance Coss of the switching device 12d from a second line 11e on a power supply side, and the sink current circuit 400 includes a resistor 500, PNP transistors 501 and 502, and a diode 503.

The resistor 500 has one end connected to the terminal VD, and the other end connected to the diode-connected PNP transistor 501 and the diode 503. Note that the diode 503 has a cathode connected to the emitter of the PNP transistor 501 and the resistor 500, and an anode connected to the terminal GN2.

Hence, when the switching voltage Vsw rises, for example, from 0 V to 400 V, a voltage Vd4 at the terminal VD results in a voltage obtained by dividing the switching voltage Vsw with the capacitor 310 and the resistor 500. Note that, here, the forward voltage (approximately 0.7 V) of the diode-connected PNP transistor 501 is ignored for convenience.

In this case, a current corresponding to the level of the switching voltage Vsw flows through the diode-connected PNP transistor 501 via the capacitor 310 and the resistor 500.

The PNP transistor 501 and the PNP transistor 502 constitute a current mirror circuit, and the PNP transistor 502 has an emitter connected to the terminal GN1.

Hence, when the switching voltage Vsw rises, the PNP transistor 502 results in absorbing, from the terminal GN1, a sink current I2 corresponding to the current I1 flowing through the capacitor 310. Note that the diode 503 is off in this event.

In contrast, when the switching device 12d is turned on and the switching voltage Vsw falls, for example, from 400 V to 0 V, the capacitor 310 is discharged through the diode 503, and a current I3 flows through the diode 503. In this way, the diode 503 (second diode) operates as an element to discharge the capacitor 310 every time the switching device 12d is turned on. Hence, in an embodiment of the present disclosure, it is possible to prevent occurrence of a DC bias voltage in the capacitor 310.

The output circuit 401 changes the cancel voltage Vnc at the terminal GN1 connected with the compensation element 14 to a high level, when the switching device 12d is turned on. The output circuit 401 includes a timing adjustment circuit 520 and a diode 521.

The timing adjustment circuit 520 generates a signal So1 for going high at the timing when the switching device 12d is turned on. Specifically, the timing adjustment circuit 520 delays the drive signal Sg such that the falling timing of the voltage Vd4 generating at the terminal VD and the rising timing of the signal So1 will be the same, and generates the signal So1.

Figure 13:
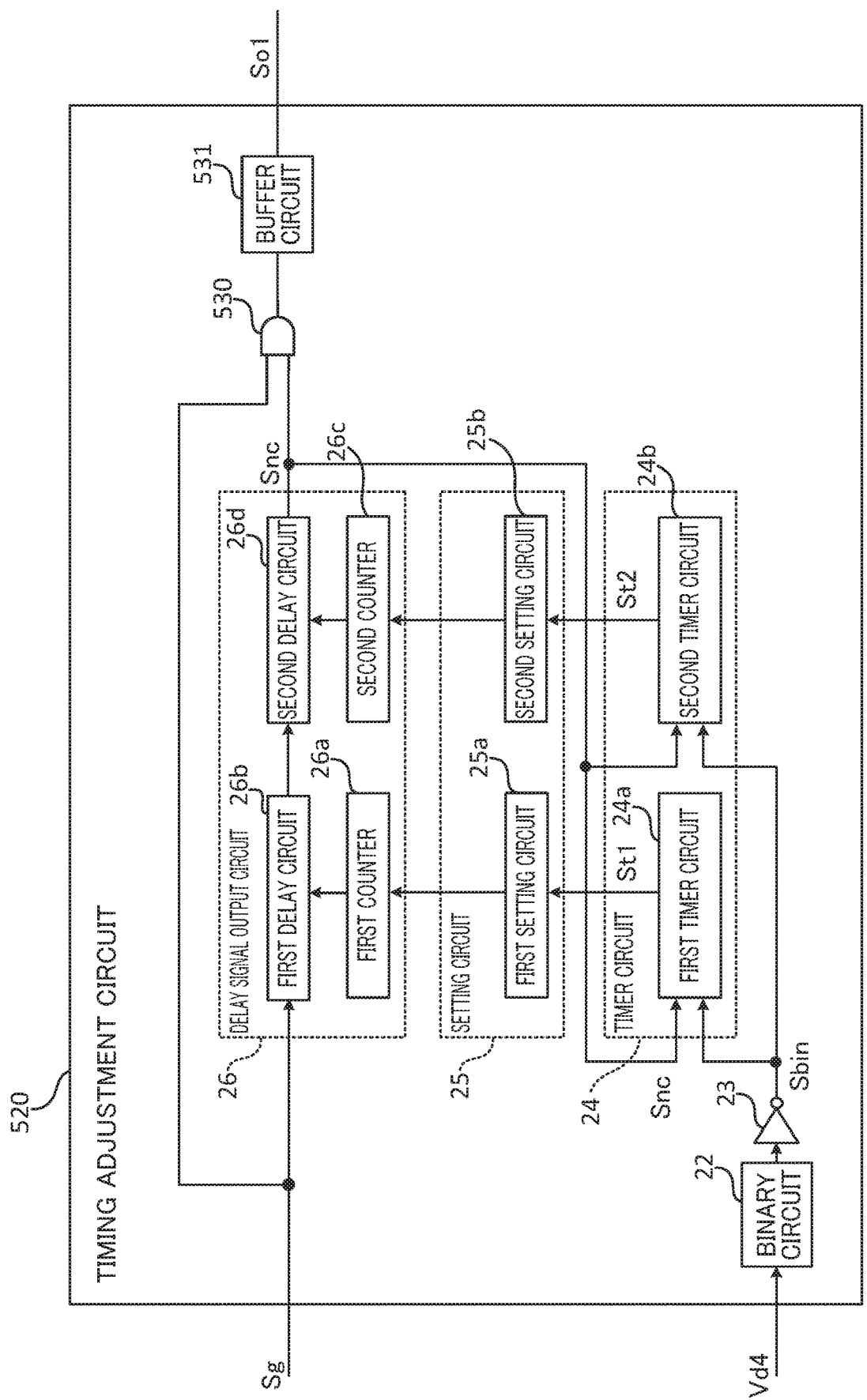
FIG. 13 is a diagram illustrating an example of a timing adjustment circuit.

FIG. 13 is a diagram illustrating an example of the timing adjustment circuit 520. The timing adjustment circuit 520 includes, for example, the binary circuit 22, the inverter 23, the timer circuit 24, the setting circuit 25, the delay signal output circuit 26, an AND circuit 530, and a buffer circuit 531.

Here, the blocks that are given the same reference numerals are the same between the integrated circuit 16 and the integrated circuit 300. It is assumed that the count value C1 of the first counter 26a is set in the timing adjustment circuit 520 such that the falling edge of the voltage Vd4, i.e., the rising edge of the binary signal Sbin, and the rising edge of the delay signal Snc for generating the signal So1 will coincide.

The AND circuit 530 calculates the logical product of the drive signal Sg and the delay signal Snc obtained by delaying the drive signal Sg by the delay time corresponding to the count value C1. Note that, as will be described later in detail, the AND circuit 530 can cause the signal So1 to go low before the switching device 12d is turned off. This reliably turns the diode 521 (which will be described later) off when the switching device 12d is off. This prevents the output circuit 401 from affecting the operation of the sink current circuit 400.

The buffer circuit 531 outputs the signal So1 having the same phase as the phase of an output from the AND circuit 530.

The diode 521 (first diode) is turned on when the signal So1 from the timing adjustment circuit 520 goes high, and is turned off when the signal So1 from the timing adjustment circuit 520 goes low. Hence, the diode 521 changes the cancel voltage Vnc at the terminal GN1 connected to the compensation element 14, to a high level, when the signal So1 goes high.

Figure 14:
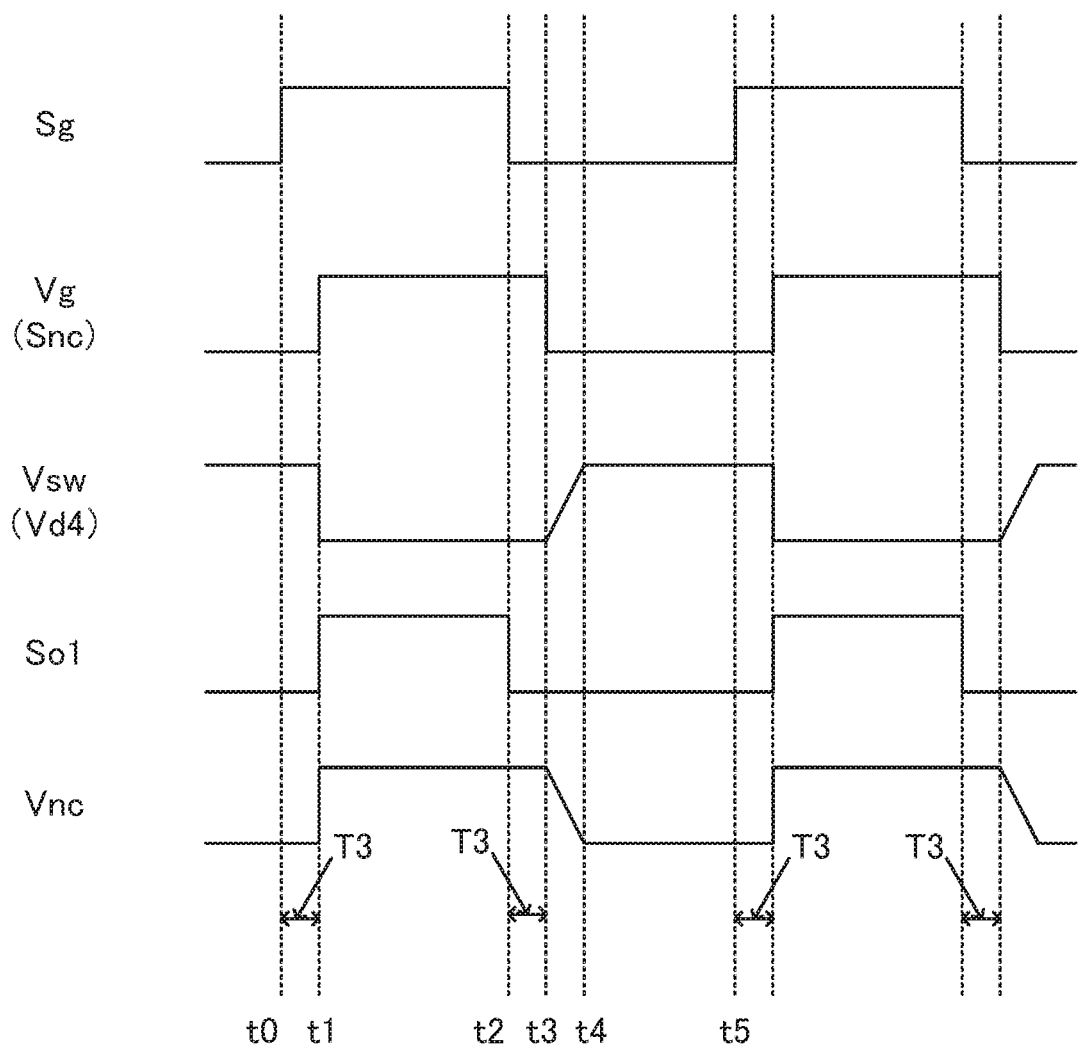
FIG. 14 is a diagram illustrating primary waveforms of an integrated circuit.

Operations of Switching Circuit 210:

FIG. 14 is a diagram illustrating operations of the switching circuit 210. It is assumed here that the time period from a time when the logic level of the drive signal Sg changes to a time when the level of the switching voltage Vsw changes is a predetermined time period T3.

At a time t1 when the predetermined time period T3 has elapsed since a time t0 at which the drive signal Sg goes high, the gate voltage Vg of the switching device 12d goes high. Then, when the gate voltage Vg of the switching device 12d goes high, the switching device 12d is turned on, which results in the switching voltage Vsw going low.

Here, the timing at which the switching voltage Vsw goes low and the timing at which the voltage Vd4 goes low are substantially the same. In an embodiment of the present disclosure, the count value C1 of the first counter 26a is set such that the falling edge of the voltage Vd4 and the rising edge of the delay signal Snc will coincide. Hence, when the gate voltage Vg goes high at the time t1, the delay signal Snc also goes high.

Since both the drive signal Sg and the delay signal Snc are high at the time t1, the signal So1 of a high level is output from the AND circuit 530. As a result, the cancel voltage Vnc of the terminal GN1 connected with the compensation element 14 also goes high.

When the drive signal Sg goes low at the time t2, the signal So1 of a low level is output from the AND circuit 530, and the diode 521 is turned off. In this event, since the electric charge of the compensation element 14 at the terminal GN1 is continuously held, the cancel voltage Vnc is kept high.

At a time t3 when the predetermined time period T3 has elapsed since the time t2 at which the drive signal Sg goes low, the gate voltage Vg of the switching device 12d goes low. As a result of this, the switching device 12d is turned off and the parasitic capacitance Coss is started to be charged, which gradually increases the switching voltage Vsw.

When the switching voltage Vsw increases, the voltage Vd4 at the terminal VD also increases. Accordingly, the sink current circuit 400 absorbs, from the terminal GN1, the sink current I2 corresponding to the current I1 flowing through the capacitor 310. As a result of this, the cancel voltage Vnc at the terminal GN1 gradually decreases to a low level at a time t4.

Here, the current I1 flowing through the capacitor 310 changes similarly to the current Is1 flowing through the parasitic capacitance Cs and the current Is2 flowing through the parasitic capacitance Coss. Hence, the sink current I2 also changes similarly to the current Is1 flowing through the parasitic capacitance Cs. In an embodiment of the present disclosure, a value of the sink current I2 and a capacitance value of the compensation element 14 are set such that a change in the switching voltage Vsw will be equal to a change in the cancel voltage Vnc of the compensation element 14 when the switching device 12d is turned off. As a result of this, the switching voltage Vsw goes high at the timing when the cancel voltage Vnc goes low at the time t4. In this way, it is possible to effectively reduce noise that is caused by applying the switching voltage Vsw to the parasitic capacitance Cs.

Note that, subsequently, when the drive signal Sg goes high at a time t5, the operations of the times t0 to t4 are repeated.

Figure 15:
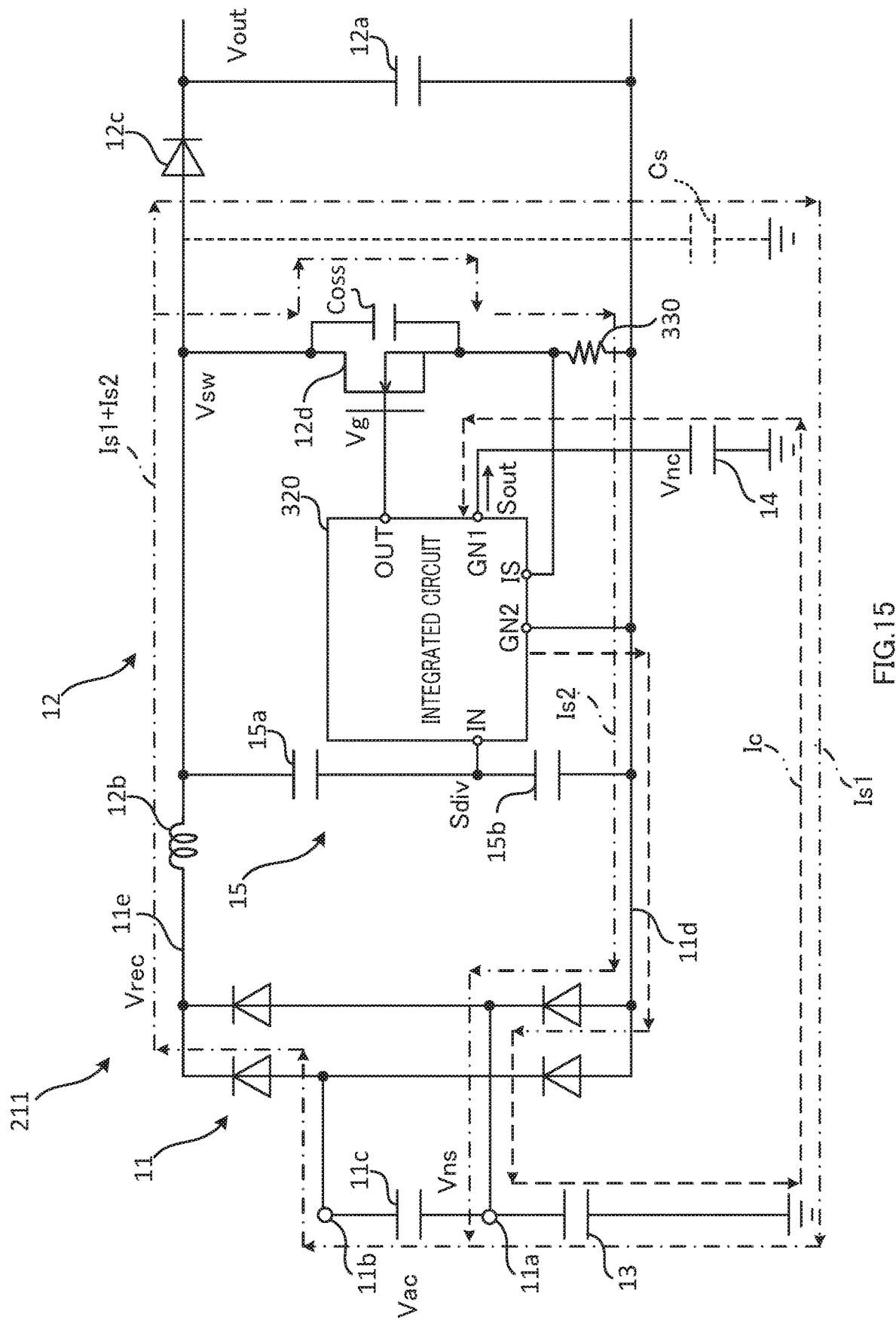
FIG. 15 is a diagram illustrating an example of a switching circuit.

Configuration of Switching Circuit 211:

FIG. 15 is a diagram illustrating an example of a switching circuit 211. The switching circuit 211 is a power supply circuit, similarly to the switching circuit 10, that performs switching of the switching device 12d. The switching circuit 211 includes, for example, the rectifier circuit 11, the boost chopper circuit 12, the grounded capacitor 13, the compensation element 14, the edge detection circuit 15, an integrated circuit 320, and a resistor 330.

Note that the blocks that are given the same reference numerals are the same between the switching circuit 10 and the switching circuit 211. In the switching circuit 211, the integrated circuit 320 is employed instead of the integrated circuit 16, and the resistor 330 is added. Hence, the integrated circuit 320 and the resistor 330 will be mainly described.

Also in the switching circuit 211 in FIG. 15, the drain-source parasitic capacitance Coss of the switching device 12d is considered.

Figure 16:
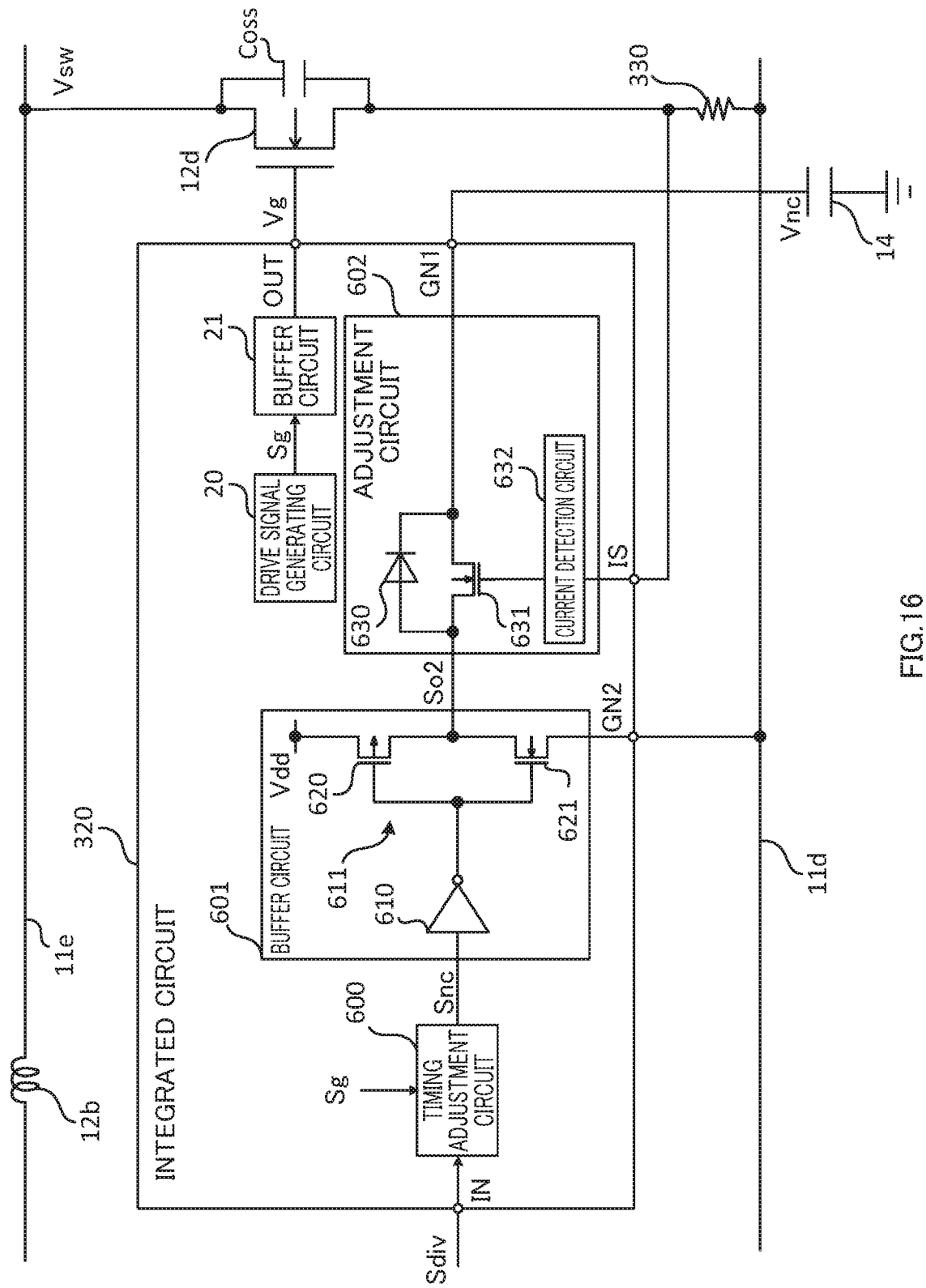
FIG. 16 is a diagram illustrating an example of an integrated circuit.

The integrated circuit 320 performs switching of the switching device 12d and also applies, to the compensation element 14, the cancel voltage Vnc following a change in the switching voltage Vsw. As illustrated in FIG. 16, the integrated circuit 320 includes the terminals IN, GN1, GN2, and OUT, a terminal IS, the drive signal generating circuit 20, the buffer circuit 21, a timing adjustment circuit 600, a buffer circuit 601, and an adjustment circuit 602. Note that the terminals IN, GN1, GN2, and OUT, the drive signal generating circuit 20, and the buffer circuit 21 are the same elements as the elements in the switching circuit 10. The timing adjustment circuit 600, the buffer circuit 601, and the adjustment circuit 602 correspond to a "drive circuit".

The resistor 330 detects the inductor current IL of the inductor 12b in the second line 11e and is provided between the source of the switching device 12d and the first line 11d on the ground side.

The terminal IS detects the inductor current IL and is connected to the resistor 330, the resistor 330 has one end connected to the ground and the other end connected to the terminal IS.

The timing adjustment circuit 600 generates the delay signal Snc having a phase opposite to the phase of the switching voltage Vsw. The timing adjustment circuit 600 includes, for example, the binary circuit 22, the inverter 23, the timer circuit 24, the setting circuit 25, and the delay signal output circuit 26 among the circuits illustrated in FIG. 2. It is assumed here that, for example, the count value C1 is set such that the switching voltage Vsw and the delay signal Snc have opposite phases.

The buffer circuit 601 outputs a signal So2 having the same phase as the phase of a delay signal Snc from the timing adjustment circuit 600 and includes inverters 610 and 611. When the delay signal Snc goes high, an output of the inverter 610 goes low. Accordingly, a PMOS transistor 620 of the inverter 611 is turned on while an NMOS transistor 621 of the inverter 611 is turned off. As a result of this, the signal So2 of a high level is output.

In contrast, when the delay signal Snc goes low, an output of the inverter 610 goes high. Accordingly, the PMOS transistor 620 is turned off while the NMOS transistor 621 is turned on. As a result of this, the signal So2 of a low level is output. Note that the PMOS transistor 620 of the inverter 611 is supplied with a predetermined voltage Vdd.

The adjustment circuit 602 adjusts a falling time of the cancel voltage Vnc according to a current value of the inductor current IL and includes a diode 630, an NMOS transistor 631, and a current detection circuit 632.

The diode 630 (third diode) is turned on when the signal So2 goes high, and is turned off when the signal So2 goes low. Note that the diode 630 has an anode connected to an output of the buffer circuit 601 and a cathode connected to the terminal GN1.

The NMOS transistor 631 is provided between the output of the buffer circuit 601 and the terminal GN1 so as to be connected in parallel to the diode 630. The voltage at the gate of the NMOS transistor 631 is controlled by the current detection circuit 632.

The current detection circuit 632 detects the inductor current IL, based on a voltage of the resistor 330 and controls the NMOS transistor 631 such that a resistance value of the drain-source resistor of the NMOS transistor 631 will decrease when the inductor current IL increases.

As described above, in an embodiment of the present disclosure, the NMOS transistor 631 (variable resistor) having a resistance value that changes according to the current value of the inductor current IL and the diode 630 are provided between the buffer circuit 601 and the terminal GN1.

In an embodiment of the present disclosure, when the signal So2 goes high, the diode 630 is turned on, and hence the cancel voltage Vnc of the terminal GN1 changes without being affected by the resistance value of the NMOS transistor 631. In contrast, when the signal So2 goes low, the diode 630 is turned off. Hence, the cancel voltage Vnc changes according to the time corresponding to the resistance value of the NMOS transistor 631.

Operation of Switching Circuit 211

Figure 17:
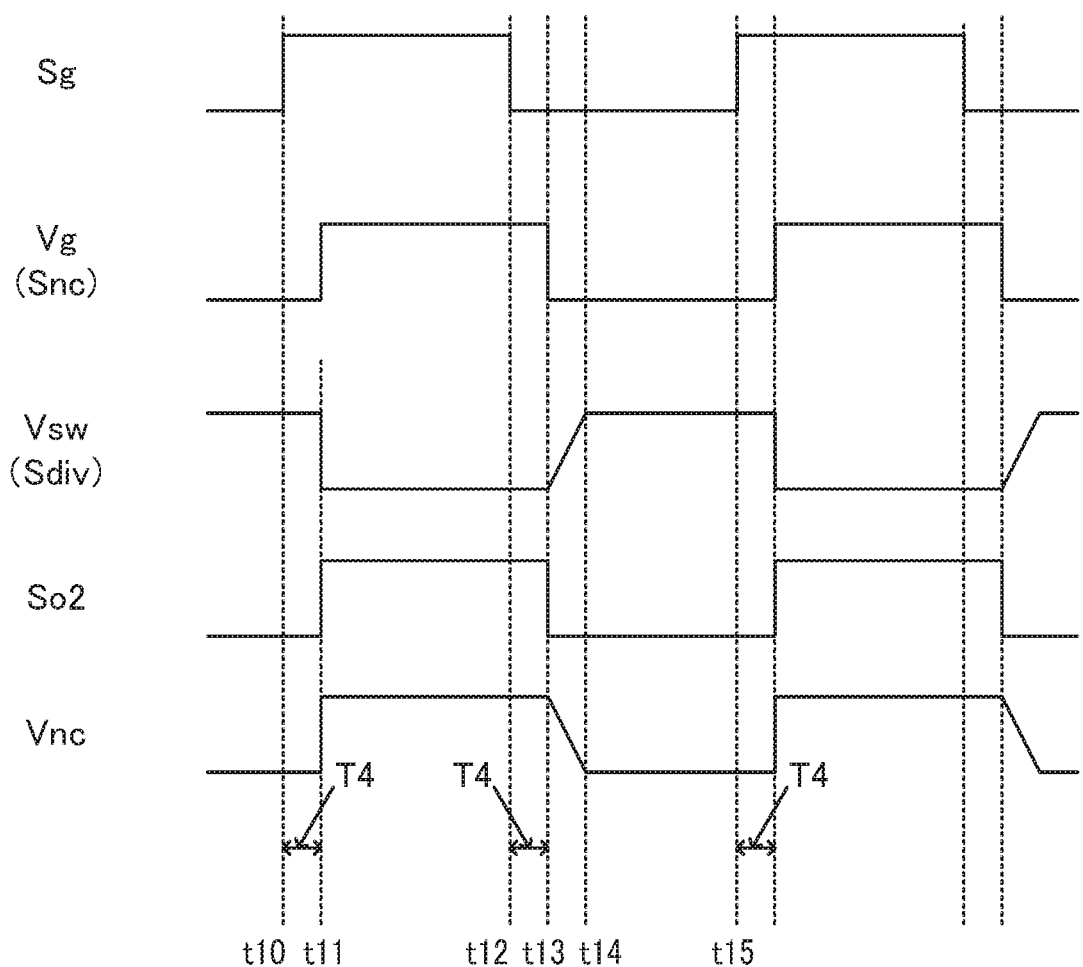
FIG. 17 is a diagram illustrating primary waveforms of an integrated circuit.

FIG. 17 is a diagram illustrating operations of the switching circuit 211. It is assumed here that the time period from a time when the logic level of the drive signal Sg changes to a time when the level of the switching voltage Vsw changes is a predetermined time period T4.

At a time t11 when the predetermined time period T4 has elapsed since a time t10 at which the drive signal Sg goes high, the gate voltage Vg of the switching device 12d goes high. Then, when the gate voltage Vg of the switching device 12d goes high, the switching device 12d is turned on, and accordingly the switching voltage Vsw goes low.

Here, the timing at which the switching voltage Vsw goes low and the timing at which the voltage-divided signal Sdiv goes low are substantially the same. In an embodiment of the present disclosure, the count value C1 of the first counter 26a is set such that the falling edge of the voltage-divided signal Sdiv and the rising edge of the delay signal Snc will coincide. Hence, when the gate voltage Vg goes high at the time t11, the delay signal Snc also goes high.

When the delay signal Snc goes high at the time t11, the signal So2 of a high level is output from the buffer circuit 601. As a result of this, the cancel voltage Vnc at the terminal GN1 connected with the compensation element 14 also goes high.

At a time t13 when the predetermined time period T4 has elapsed from a time t12 at which the drive signal Sg goes low, the gate voltage Vg of the switching device 12d goes low. As a result of this, the switching device 12d is turned off and the parasitic capacitance Coss starts being charged, which gradually increases the switching voltage Vsw.

When the delay signal Snc goes low at a time t13, the signal So2 of a low level is output from the buffer circuit 601. As a result of this, the diode 630 is turned off, the electric charge of the compensation element 14 is discharged through the terminal GN1, the NMOS transistor 631, and the NMOS transistor 621, and the cancel voltage Vnc goes low at a time t14.

In this event, an ON resistance of the NMOS transistor 631 is a resistance value corresponding to the value of the inductor current IL. Specifically, when the inductor current IL increases, the resistance value of the ON resistance of the NMOS transistor 631 decreases. Hence, in a case where the inductor current IL is large and the switching voltage Vsw increases over a short time, the cancel voltage Vnc also decreases over a short period of time. In contrast, in a case where the inductor current IL is small and the switching voltage Vsw increases over a long time, the cancel voltage Vnc also decreases over a long period of time.

As a result of this, in an embodiment of the present disclosure, it is possible to cause the transition of the cancel voltage Vnc at the terminal GN1 to follow the transition of the switching voltage Vsw, thereby being able to effectively reduce noise that is caused by applying the switching voltage Vsw to the parasitic capacitance Cs.

Note that, subsequently, when the drive signal Sg goes high at a time t15, the operations of the times t10 to t14 are repeated.

Summary:

The switching circuits 10, 210, and 211 according to an embodiment of the present disclosure have been described above. For example, in the integrated circuits 300 and 320, the cancel voltage Vnc is raised to a high level when the drive signal Sg goes high, whereas the cancel voltage Vnc is lowered to a low level when the drive signal Sg goes low. Accordingly, the cancel voltage Vnc for passing the compensation current Ic in the direction opposite to the direction of the leakage current Is is generated in the compensation element 14, thereby being able to reduce the leakage current Is.

When the switching device 12d is turned off, the sink current circuit 400 changes the cancel voltage Vnc with the sink current I2 corresponding to the switching voltage Vsw.

Accordingly, it is possible to change the cancel voltage Vnc so as to follow the switching voltage Vsw, thereby being able to accurately cancel noise of the grounded capacitor 13 occurring based on the leakage current Is.

The diode 521, which is turned off when the signal So1 goes low, is provided in the output circuit 401. Accordingly, it is possible for the sink current circuit 400 to change the cancel voltage Vnc so as to follow the switching voltage Vsw without being affected by the output circuit 401.

When the switching device 12*d* is turned off, the parasitic capacitance Coss is in a discharge state. In an embodiment of the present disclosure, the capacitor 310 connected to the terminal VD is discharged by the diode 503 every time the switching device 12*d* is turned on. Accordingly, when the switching device 12*d* is turned off, the state of the capacitor 310 and the state of the parasitic capacitance Coss can be made the same. Hence, it is possible to change the cancel voltage Vnc to accurately follow the switching voltage Vsw.

The integrated circuit 16 in an embodiment of the present disclosure outputs, to the compensation element 14 through the terminal GN1, the output signal Sout that goes high when the drive signal Sg goes high and goes low when the drive signal Sg goes low. This makes it possible to apply, to the compensation element 14, the cancel voltage Vnc for passing the compensation current Ic in the direction opposite to the direction of the leakage current Is. Hence, it is possible to reduce the leakage current Is.

The adjustment circuit 602 can change the time period in which the cancel voltage Vnc changes from a high level to a low level, according to the inductor current IL. Hence, it is possible, in an embodiment of the present disclosure, to cause the cancel voltage Vnc to accurately follow the switching voltage Vsw.

The adjustment circuit 602 includes the NMOS transistor 631 having a resistance value that decreases when the inductor current IL increases. The time period in which the cancel voltage Vnc changes from a high level to a low level changes with the value of the ON resistance of the NMOS transistor 631. Hence, in an embodiment of the present disclosure, the time period in which the cancel voltage Vnc changes from a high level to a low level can be adjusted using a simple configuration.

To reduce the influence of the leakage current Is generated according to the switching voltage Vsw, for example, the drive signal Sg may be output to the compensation element 14 through a buffer circuit (not illustrated) or directly through the terminal GN1. However, the switching voltage Vsw has a phase opposite to the phase of a signal obtained by delaying the drive signal Sg. Thus, in such a case, it is difficult to effectively reduce the influence of the leakage current Is. In an embodiment of the present disclosure, the output signal Sout (delay signal Snc) obtained by delaying the drive signal Sg by a predetermined time period is output to the compensation element 14. Hence, in an embodiment of the present disclosure, it is possible to effectively reduce the influence of the leakage current Is at the AC input terminal 11*a*.

In an embodiment of the present disclosure, the setting circuit 25 sets the count value C1 (setting information) such that the time period T1 will be within the time period Tx, that is, the delay signal Snc will have a phase opposite to the phase of the switching voltage Vsw. In this way, in an embodiment of the present disclosure, since the delay signal Snc has a phase opposite to the phase of the switching voltage Vsw, the influence of the leakage current Is at the AC input terminal 11*a* can be effectively reduced.

In an embodiment of the present disclosure, to cause the delay signal Snc to have a phase opposite to the phase of the switching voltage Vsw, the first timer circuit 24*a* measures the time period T1 between the rising edge of the delay signal Snc and the rising edge of the binary signal Sbin. The second timer circuit 24*b* measures the time period T2 between the falling edge of the delay signal Snc and the falling edge of the binary signal Sbin. Regardless of either of the first timer circuits being used, it is possible to cause the delay signal Snc to have a phase opposite to the phase of the switching voltage Vsw.

In general, the switching voltage Vsw is an extremely high voltage, and thus it is difficult to directly apply such a voltage to the integrated circuit 16. However, in an embodiment of the present disclosure, the binary signal Sbin is generated based on the voltage-divided signal Sdiv from the edge detection circuit 15. This makes it possible to accurately grasp the timing of change in the switching voltage Vsw, even when the high switching voltage Vsw cannot be directly input to the integrated circuit 16.

As the compensation element 14 connected to the integrated circuit 16 in an embodiment of the present disclosure, a capacitor is used similarly to the parasitic capacitance Cs. Hence, it is possible to accurately pass the compensation current Ic in the direction opposite to the direction of the leakage current Is, as compared to a case where a resistor is used as the compensation element 14, for example.

The above embodiments of the present disclosure are simply for facilitating the understanding of the present disclosure and are not in any way to be construed as limiting the present disclosure. The present disclosure may variously be changed or altered without departing from its spirit and encompass equivalents thereof.

For example, when the capacitance value of the compensation element 14 is sufficiently small, the delay signal Snc may be output from the delay signal output circuit 26 to the compensation element 14 without passing through the buffer circuit 27.

An embodiment of the present disclosure has been described using a PFC circuit as an example, but the present disclosure is not limited thereto. For example, the leakage current Is is generated in any switching device (power transistor in which a parasitic capacitance is generated) of a typical DC-DC converter or AC-DC converter, and thus the integrated circuit 16 is also applicable to such a circuit.

In an embodiment of the present disclosure, the process in FIG. 4 is performed by the setting circuit 25 and/or the like but may be performed, for example, by a microcomputer or a DSP through arithmetic processing.

In the integrated circuit 300, the timing adjustment circuit 520 is used, but the present disclosure is not limited thereto. For example, the output circuit 116 may be used instead of the timing adjustment circuit 520. Even with such a configuration, effects similar to the effects of embodiments of the present disclosure can be obtained.

In the integrated circuit 320, the timing adjustment circuit 600 is used, but the present disclosure is not limited thereto. For example, the output circuit 116 may be used instead of the timing adjustment circuit 600. Even with such a configuration, effects similar to the effects of embodiments of the present disclosure can be obtained.

What is claimed is:

1. An integrated circuit for driving a switching device provided between a first line and a second line, while a power supply voltage is applied between a first input terminal connected to the first line and a second input terminal connected to the second line, the integrated circuit comprising:
- a first terminal to be connected to one end of a circuit element for canceling a leakage current caused by switching operation of the switching device, an other end of the circuit element being grounded;
- an output terminal through which a drive signal for driving the switching device is output to the switching device;
- a drive circuit configured to
  - output the drive signal through the output terminal, and
  - set a voltage at the first terminal to be one logic level upon the switching device being turned on, so that the circuit element generates a compensation current for canceling the leakage current;
- a second terminal connected to a second capacitor, the second capacitor having one end connected to a node of the switching device on the power supply side and another end connected to the second terminal; and
- a second diode having a cathode connected to the second terminal and an anode connected to the first line, wherein the drive circuit comprises
- an output circuit that outputs an output signal at the one logic level to the circuit element through the first terminal, upon the switching device being turned ON, and
- a sink current circuit that absorbs, from the first terminal, a sink current corresponding to a current flowing through the switching device from the second line, upon the switching device being turned OFF, and the sink current circuit is a current mirror circuit that generates the sink current based on a current flowing through the second capacitor.

2. The integrated circuit according to claim 1, wherein the output circuit comprises
- a delay circuit that outputs a delay signal obtained by delaying the drive signal by a predetermined time period,
- a buffer circuit that outputs the output signal based on the delay signal, and
- a first diode provided between the buffer circuit and the first terminal, the first diode being configured to be ON upon the switching device being turned ON, and be OFF upon the switching device being turned OFF.

3. The integrated circuit according to claim 2, further comprising:
- a second terminal connected to a second capacitor, the second capacitor having one end connected to a node of the switching device on the power supply side and another end connected to the second terminal; and
- a second diode having a cathode connected to the second terminal and an anode connected to the first line, wherein
the sink current circuit is a current mirror circuit that generates the sink current, based on a current flowing through the second capacitor.

4. The integrated circuit according to claim 2, wherein the output circuit further comprises
- a timer circuit that measures a time period between a timing of a change in logic level of the delay signal and a timing of a change in a first voltage generated between opposite ends of the switching device when the switching device is driven,
- a storage circuit that stores setting information for setting a time period for delaying the drive signal, and
- a setting circuit that sets, in the storage circuit, the setting information for causing the delay signal to have a phase opposite to a phase of the first voltage, based on a time measurement result of the timer circuit, and wherein
the delay circuit delays the drive signal by a time period defined by the setting information.

5. The integrated circuit according to claim 4, wherein the timer circuit measures the time period between a rising edge of the delay signal and a falling edge of the first voltage.

6. The integrated circuit according to claim 4, wherein the timer circuit measures the time period between a falling edge of the delay signal and a rising edge of the first voltage.

7. The integrated circuit according to claim 4, further comprising:
- a signal output circuit that outputs a signal at one logic level to the timer circuit when a second voltage from a voltage divider circuit that divides the first voltage is higher than a predetermined voltage, and outputs a signal at another logic level to the timer circuit when the second voltage is lower than the predetermined voltage, wherein
the voltage divider circuit comprises a third capacitor provided between the first line and the second line.

8. The integrated circuit according to claim 1, wherein the drive circuit comprises
- an output circuit that outputs, to the circuit element through the first terminal, an output signal at the one logic level when the logic level of the drive signal of the switching device becomes the one logic level for turning ON the switching device, and outputs the output signal at an other logic level when the logic level of the drive signal becomes the other logic level for turning OFF the switching device.

9. The integrated circuit according to claim 8, wherein the output circuit comprises
- a delay circuit that outputs a delay signal obtained by delaying the drive signal by a predetermined time period, and
- a buffer circuit that outputs the output signal to the circuit element, based on the delay signal.

10. The integrated circuit according to claim 8, wherein the output circuit comprises
- a delay circuit that outputs a delay signal obtained by delaying the drive signal by a predetermined time period,
- a buffer circuit that outputs a signal that is based on the delay signal, and
- an adjustment circuit that
  - outputs the output signal at the one logic level to the circuit element, when the logic level of a signal from the buffer circuit becomes the one logic level, and
  - outputs, to the circuit element, the output signal, a level of which becomes the other logic level over a time period defined by an amount of an inductor current of an inductor connected in the second line, when the logic level of the signal from the buffer circuit becomes the other logic level.

11. The integrated circuit according to claim 10, wherein the adjustment circuit comprises a third diode provided between the buffer circuit and the first terminal, the third diode being configured to be ON when the signal from the buffer circuit is at the one logic level and be OFF when the signal from the buffer circuit is at the other logic level, and a variable resistor connected in parallel to the third diode, the variable resistor having a variable resistance value that decreases when the value of the inductor current of the inductor provided to the second line increases.

12. The integrated circuit according to claim 1, wherein the circuit element is a capacitor.

13. The integrated circuit according to claim 1, wherein the first input terminal connected to the first line and the second input terminal connected to the second line constitute input terminals of a rectifier circuit that converts an AC voltage applied between the input terminals thereof to a DC voltage, the rectifier circuit being connected to a boost chopper circuit including the switching device.

14. An integrated circuit for driving a switching device provided between a first line and a second line, while a power supply voltage is applied between a first input terminal connected to the first line and a second input terminal connected to the second line, the first input terminal being grounded through a first capacitor, the integrated circuit comprising:

a first terminal to be connected to one end of a circuit element which differs from the first capacitor, an other end of the circuit element being grounded;

an output terminal through which a drive signal for driving the switching device is output to the switching device; and a drive circuit configured to output the drive signal through the output terminal, and set a voltage at the first terminal to be one logic level upon the switching device turning on by the drive signal, and set the voltage at the first terminal to be the other logic level upon the switching device turning off by the drive signal, wherein the drive circuit generates the drive signal and includes a time adjustment circuit, the driving signal having a first rising edge and a first falling edge, and the time adjustment circuit includes a first delay circuit and a second delay circuit both of which delay the drive signal so that the time adjustment circuit generates the voltage at the first terminal from the drive signal, the first delay circuit delaying the drive signal by delaying the first rising edge by a first delay time, the second delay circuit delaying the drive signal by delaying the first falling edge by a second delay time.

15. The integrated circuit according to claim 14, wherein the drive circuit includes an output circuit that outputs an output signal at the one logic level to the circuit element through the first terminal, upon the switching device being turned on, and a sink current circuit that absorbs, from the first terminal, a sink current corresponding to a current flowing through the switching device from the second line, upon the switching device being turned off.

16. The integrated circuit according to claim 14, wherein the drive circuit further includes a binary circuit which generates a binary signal based on a predetermined voltage obtained from a voltage difference between the first line and the second line, the binary signal having a second rising edge and a second falling edge, and the time adjustment circuit includes:

a first timer circuit which compares the first rising edge of the drive signal with the second rising edge of the binary signal to generate a first comparison result, a second timer circuit which compares the first falling edge of the drive signal with the second falling edge of the binary signal to generate a second comparison result, a first setting circuit which sets the first delay time based on the first comparison result, and a second setting circuit which sets the second delay time based on the second comparison result.

17. An integrated circuit for driving a switching device provided between a first line and a second line, while a power supply voltage is applied between a first input terminal connected to the first line and a second input terminal connected to the second line, the first input terminal being grounded through a first capacitor, the integrated circuit comprising:

a first terminal to be connected to one end of a circuit element which differs from the first capacitor, an other end of the circuit element being grounded;

an output terminal through which a drive signal for driving the switching device is output to the switching device; and a drive circuit configured to output the drive signal through the output terminal, wherein a first predetermined current flows through the first terminal in a first direction in the drive circuit upon the switching device being turned on by the drive signal, a second predetermined current flows through the first terminal in a second direction opposite to the first direction in the drive circuit, upon the switching device being turned off by the drive signal, the drive circuit further includes a comparator, a first current source generating a first current and a second current source generating a second current, the comparator includes a first input connected to an adjustment capacitor, a second input connected to a reference voltage, and an output connected to the first terminal of the integrated circuit, the first current from the first current source flows into the adjustment capacitor upon the switching device being turned on by the drive signal thereby the first predetermined current flowing in the first direction, and the second current from the second current source is sunk from the adjustment capacitor upon the switching device being turned off by the drive signal thereby the second predetermined current flowing in the second direction.

18. The integrated circuit according to claim 17, further comprising a second terminal connected to the adjustment capacitor, wherein the first input of the comparator is connected through the second terminal to the adjustment capacitor, and the comparator compares a voltage at the second terminal connected to the adjustment capacitor with the reference voltage, the first predetermined current flows upon the voltage at the second terminal being greater than the reference voltage after the first current from the first current source flows through the second terminal into the adjustment capacitor, and the second predetermined current flows upon the voltage at the second terminal being smaller than the reference voltage after the second current from the second current source is sunk through the second terminal from the adjustment capacitor.

\* \* \* \* \*